(12) United States Patent
Oga

(10) Patent No.: US 10,170,684 B2
(45) Date of Patent: Jan. 1, 2019

(54) TUNING FORK TYPE CRYSTAL BLANK, TUNING FORK TYPE CRYSTAL ELEMENT, AND CRYSTAL DEVICE

(71) Applicant: KYOCERA CORPORATION, Kyoto-Shi, Kyoto (JP)

(72) Inventor: Takahiro Oga, Higashine (JP)

(73) Assignee: KYOCERA CORPORATION, Kyoto (JP)

( * ) Notice: Subject to any disclaimer, the term of this patent is extended or adjusted under 35 U.S.C. 154(b) by 59 days.

(21) Appl. No.: 15/280,791

(22) Filed: Sep. 29, 2016

(65) Prior Publication Data

US 2017/0098755 A1 Apr. 6, 2017

(30) Foreign Application Priority Data

Sep. 30, 2015 (JP) .................................. 2015-192408
May 30, 2016 (JP) .................................. 2016-107085

(51) Int. Cl.
    *H03H 9/21* (2006.01)
    *H01L 41/053* (2006.01)
    *H01L 41/047* (2006.01)
    *H03H 3/02* (2006.01)

(52) U.S. Cl.
    CPC .......... *H01L 41/053* (2013.01); *H01L 41/047* (2013.01); *H03H 3/02* (2013.01); *H03H 9/21* (2013.01); *H03H 2003/026* (2013.01)

(58) Field of Classification Search
    CPC ............. H03H 9/19; H03H 9/21; H03H 9/215
    See application file for complete search history.

(56) References Cited

U.S. PATENT DOCUMENTS

| 7,521,846 B2 * | 4/2009 | Tanaya .............. G01C 19/5607 310/368 |
| 8,174,171 B2 * | 5/2012 | Iwai ....................... H03H 9/215 310/370 |
| 8,593,039 B2 * | 11/2013 | Yamada ................... H03H 3/02 310/370 |
| 2005/0017604 A1 | 1/2005 | Yamada |
| 2006/0082261 A1 | 4/2006 | Tanaya |
| 2009/0167118 A1 * | 7/2009 | Yoshimatsu ............. H03H 3/02 310/370 |

(Continued)

FOREIGN PATENT DOCUMENTS

| CN | 100596020 C | 3/2010 |
| JP | 4049017 B2 | 12/2007 |

*Primary Examiner* — J. San Martin
(74) *Attorney, Agent, or Firm* — Westerman, Hattori, Daniels & Adrian, LLP

(57) ABSTRACT

A tuning fork type crystal blank includes a base part, a pair of vibrating parts which extend from the base part parallel with each other, an auxiliary part including a support part located on one side of an alignment direction of the pair of vibrating parts relative to the base part and pair of vibrating parts and extending parallel with the pair of vibrating parts, and a holding part which is located on the opposite side to the pair of vibrating parts relative to the base part and connects the base part and the support part. When viewed in a planar view direction perpendicular to the alignment direction and to the direction in which the pair of vibrating parts extend, cut away part is formed in a side surface of the auxiliary part.

20 Claims, 17 Drawing Sheets

(56) References Cited

U.S. PATENT DOCUMENTS

| | | | | |
|---|---|---|---|---|
| 2011/0068876 A1* | 3/2011 | Yamada | ............... | H03H 9/1021 |
| | | | | 331/158 |
| 2011/0248600 A1* | 10/2011 | Yamada | ................... | H03H 9/21 |
| | | | | 310/300 |
| 2015/0255701 A1* | 9/2015 | Kobayashi | ............ | H01L 41/053 |
| | | | | 310/344 |

* cited by examiner

FIG.6
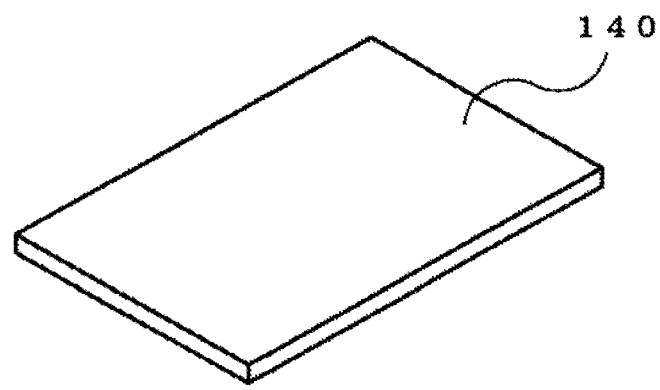
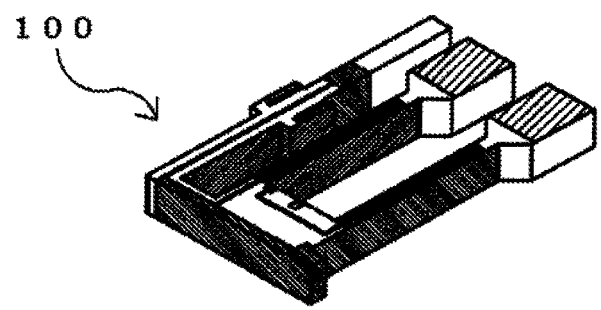
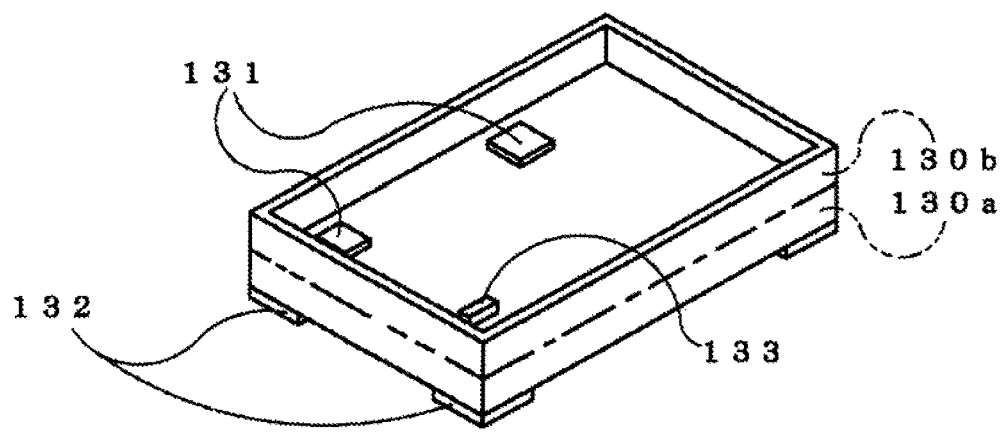

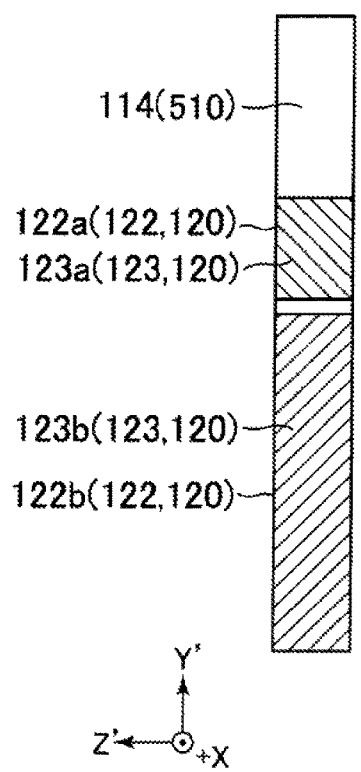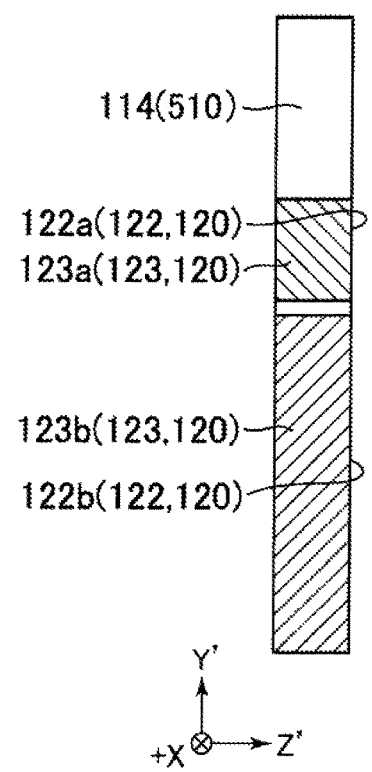

US 10,170,684 B2

TUNING FORK TYPE CRYSTAL BLANK, TUNING FORK TYPE CRYSTAL ELEMENT, AND CRYSTAL DEVICE

TECHNICAL FIELD

The present invention relates to a tuning fork type crystal blank, tuning fork type crystal element, and crystal device in which a tuning fork type crystal element is mounted. The crystal device is for example a crystal unit or crystal oscillator.

BACKGROUND ART

A tuning fork type crystal element is for example configured by a tuning fork type crystal blank and metal patterns which are formed on the surface of the crystal blank. The crystal blank has a base part, vibrating parts which extend outward from a predetermined side surface of the base part, and a support part which extends outward from the predetermined side surface of the base part in the same direction as the vibrating parts. The metal patterns include excitation electrode parts provided in the vibrating parts, terminal parts provided on the base part and support part, and wiring parts which electrically connect the excitation electrode parts and the terminal parts (see for example Patent Literature 1).

When using such a tuning fork type crystal element for a crystal device, the terminal parts of the tuning fork type crystal element and connection pads provided on the upper surface of a board part are electrically joined by a conductive adhesive to mount the tuning fork type crystal element on the upper surface of the board part. Next, the upper surface of the board part having this tuning fork type crystal element mounted thereon is joined with a lid member whereby the tuning fork type crystal element is air-tightly sealed. Patent Literature 1 does not allude to the shapes of detailed parts of the support part.

CITATION LIST

Patent Literature

Patent Literature 1. Japanese Patent No. 4049017B2

SUMMARY OF INVENTION

A tuning fork type crystal blank according to one aspect includes a base part, a pair of vibrating parts which extend from the base part in parallel with each other, an auxiliary part including a support part which is located at one side of the base part and the pair of vibrating parts in an alignment direction of the pair of vibrating parts and extends parallel with the pair of vibrating parts, and a holding part which is located on the side of the base part opposite to the pair of vibrating parts and connects the base part and the support part. A cut away part is formed in a side surface of the auxiliary part when viewed in a planar view direction which is perpendicular to the alignment direction and the extension direction of the pair of vibrating parts.

A tuning fork type crystal element according to one aspect includes the above crystal blank and metal pattern provided on the surface of the tuning fork type crystal blank. The metal pattern includes first excitation electrode parts which are located on the pair of vibrating parts, second excitation electrode parts which are located on the pair of vibrating parts, a first terminal part which is located on a part of the support part at a front end side from the base part or on a part of the holding part at the opposite side to the support part in the alignment direction, a second terminal part which is located on at least one of a part of the support part at a root side and a part of the holding part at the support part side in the alignment direction, a first wiring part which connects the first excitation electrode parts and the first terminal part, and a second wiring part which connects the second excitation electrode parts and the second terminal part.

A crystal device according to one aspect includes the above tuning fork type crystal element, a board part provided with a pair of connection pads to which the first terminal part and the second terminal part are electrically joined, a frame part which is integrally provided with the board part along the edge part of the upper surface of the board part, and a lid member which is joined to the upper surface of the frame part.

A method for producing a tuning fork type crystal element according to one aspect includes a crystal blank forming step of forming a tuning fork type crystal blank by etching and a metal pattern forming step of forming a metal pattern on the tuning fork type crystal blank by a lift-off method. The tuning fork type crystal blank formed in the crystal forming step includes a base part, a pair of vibrating parts which extend from the base part in parallel with each other, an auxiliary part including a support part which is located on one side of the base part and the pair of vibrating parts in an alignment direction of the pair of vibrating parts and extends parallel with the pair of vibrating parts, and a holding part which is located on the opposite side of the base part from the pair of vibrating parts and connects the base part and the support part. A cut away part is formed in a side surface of the auxiliary part when viewed in the direction perpendicular to the alignment direction and to the direction in which the support part extends. In the metal pattern forming step, a metal film which becomes the metal pattern is formed in a state where the cut away part is covered from the two sides of the perpendicular direction by a lifted off resist.

BRIEF DESCRIPTION OF DRAWINGS

FIG. 6 is a disassembled perspective view of a crystal device according to the first embodiment.

FIG. 11A is a plan view of a tuning fork type crystal element according to the second embodiment showing the side surface of the support part facing the side opposite to the vibrating parts, and FIG. 11B is a plan view of the tuning fork type crystal element according to the second embodiment showing the side surface of the support part facing the vibrating parts.

FIG. 15A is a cross-sectional view showing a continuation from FIG. 14C, while

DESCRIPTION OF EMBODIMENTS

Figure 1:
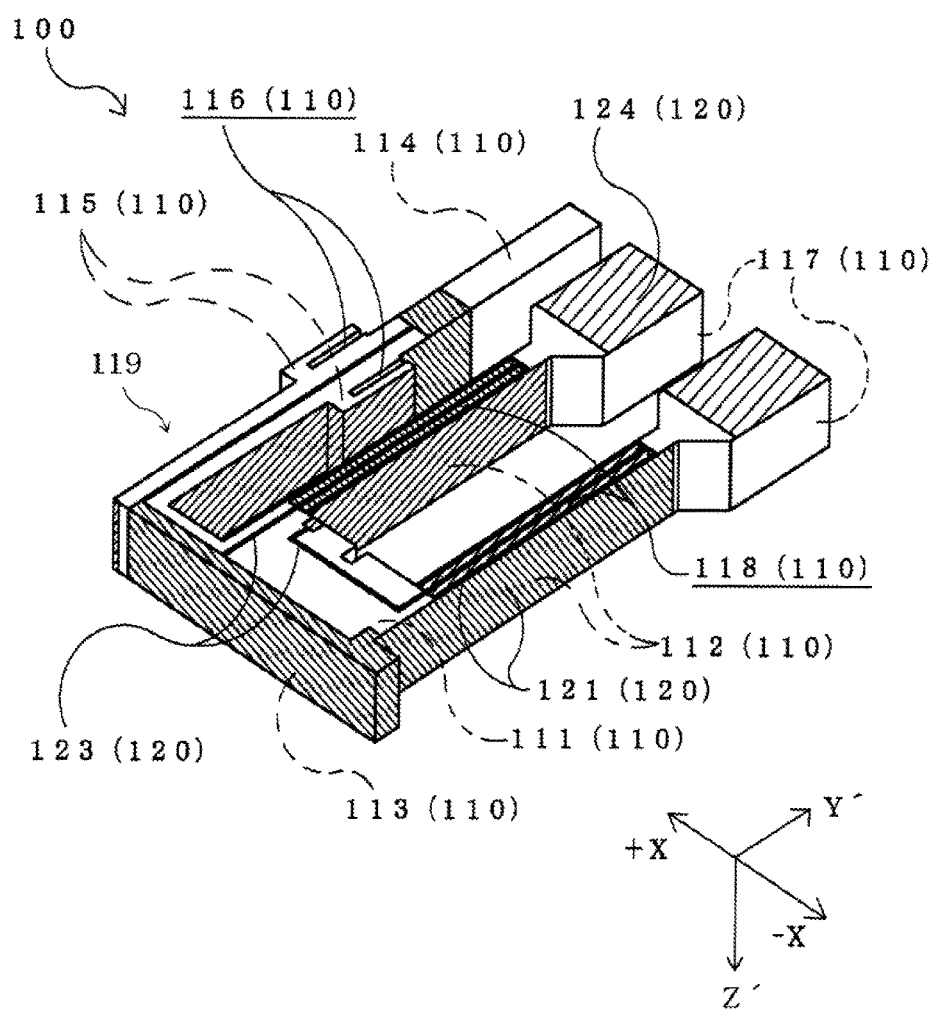
FIG. 1 is a perspective view of a tuning fork type crystal element according to a first embodiment.

First Embodiment (Configuration of Tuning Fork Type Crystal Element)

A tuning fork type crystal element 100 according to a first embodiment can generate stable mechanical vibration and is for generating a reference signal of an electronic apparatus or the like. Further, the tuning fork type crystal element 100 according to the first embodiment, as shown in FIG. 1 to FIGS. 3A and 3B, is configured by a crystal blank 110 and metal patterns 120. Note that, in the following explanation of the shape of the crystal blank 110, the effects of anisotropy of the crystal with respect to etching (such as system error) is ignored unless otherwise indicated. This is true for accidental error as well.

(Configuration of Crystal Blank)

The crystal blank 110, as shown in FIG. 1 to FIGS. 3A and 3B, is configured by a base part 111, vibrating parts 112 (112a, 112b), a holding part 113, a support part 114, and protruding parts 115 (115a, 115b) having the cut away parts 116 (116a, 116b) formed therein. The support part 114 and protruding parts 115 configure an auxiliary part 119. Note that, in FIG. 2, for convenience, a boundary between the holding part 113 and other parts (base part 111 and support part 114) is indicated by a broken line BL. The crystal blank 110 is for example prepared from a crystal wafer having crystal axes comprised of an X-axis, Y-axis, and Z-axis perpendicular to each other by using photolithography and etching whereby the base part 111, vibrating parts 112, holding part 113, support part 114, and protruding parts 115 (cut away parts 116) are integrally formed.

Figure 2:
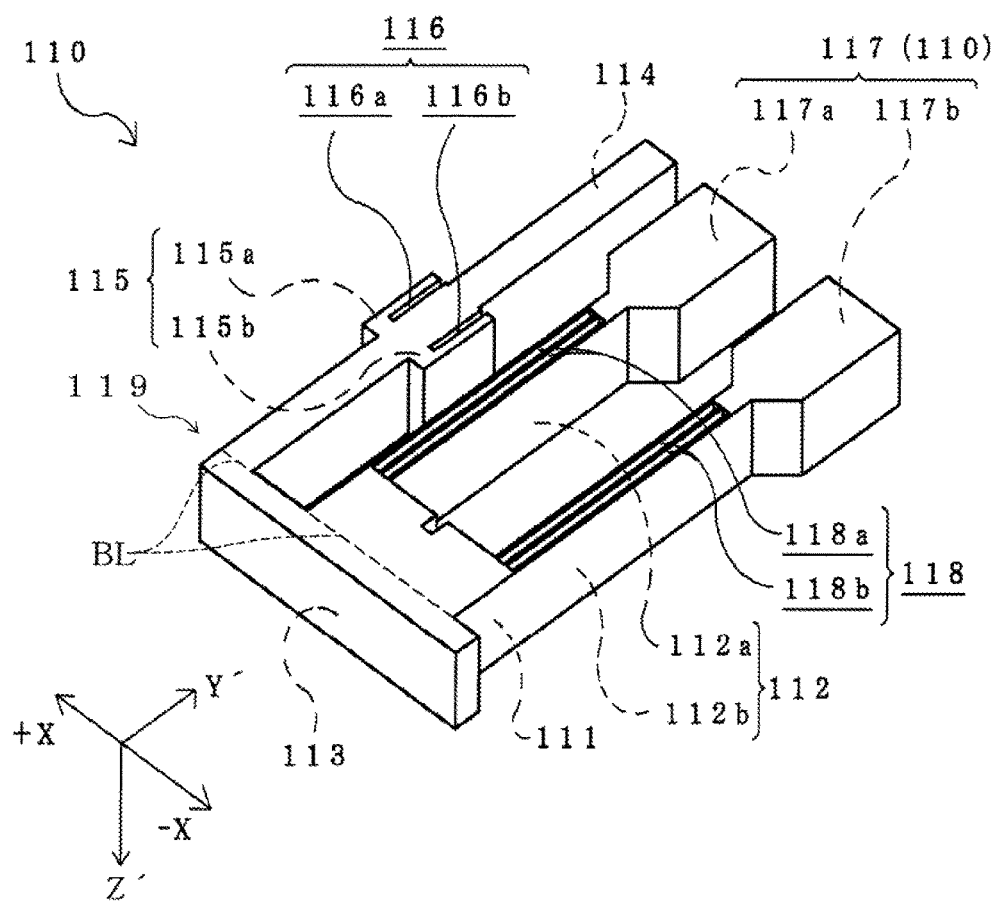
FIG. 2 is a perspective view of a crystal blank used in the tuning fork type crystal element according to the first embodiment.
Figure 3A:
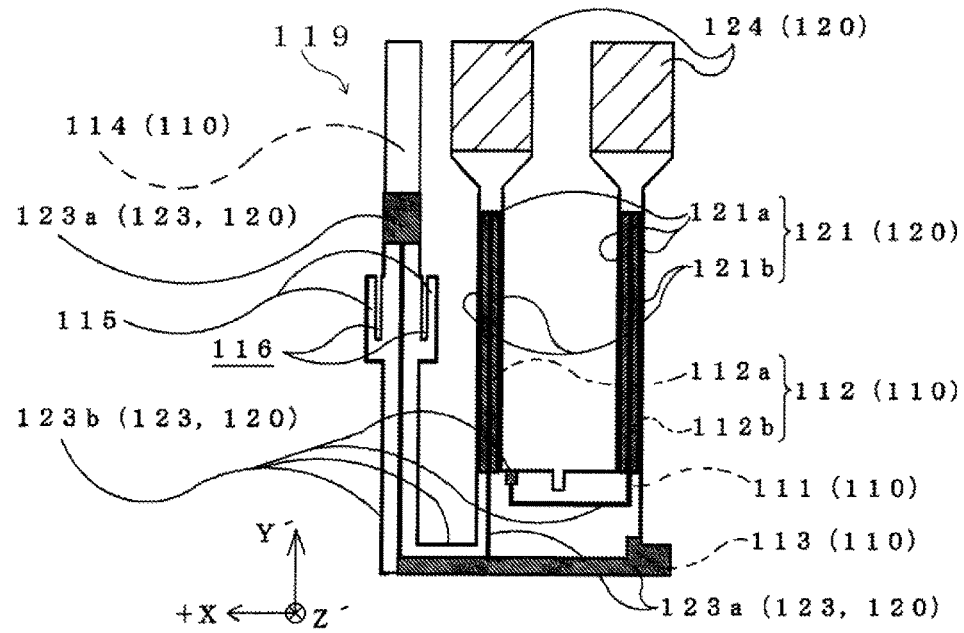
FIG. 3A is a plan view of the upper surface of the tuning fork type crystal element according to the first embodiment.
Figure 3B:
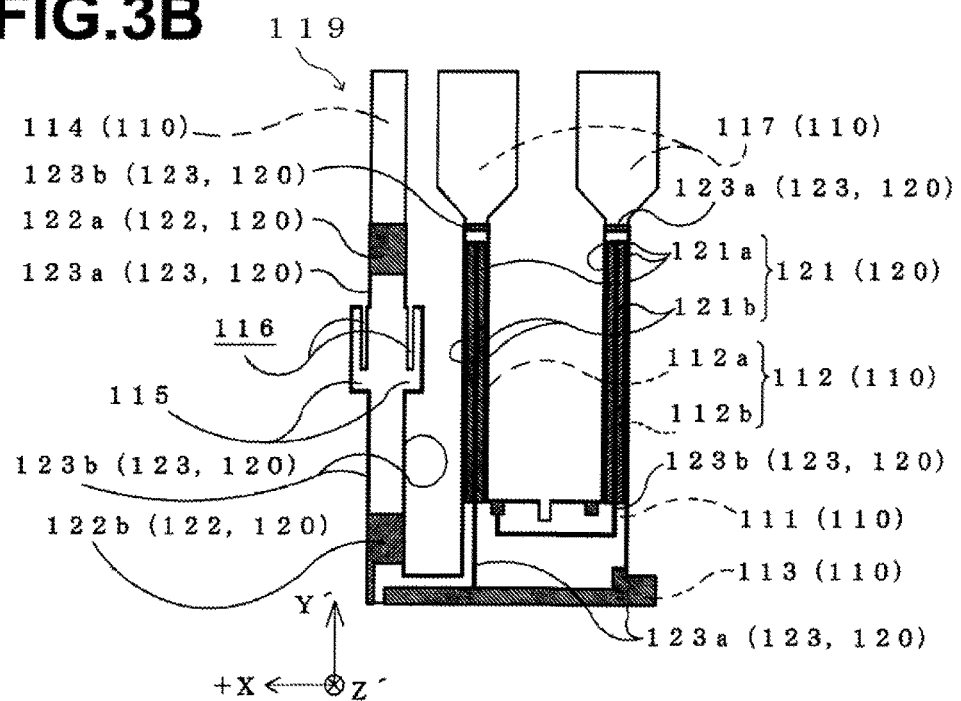
FIG. 3B is a plan view of the lower surface of the tuning fork type crystal element according to the first embodiment seen through the upper surface.
Figure 4A:
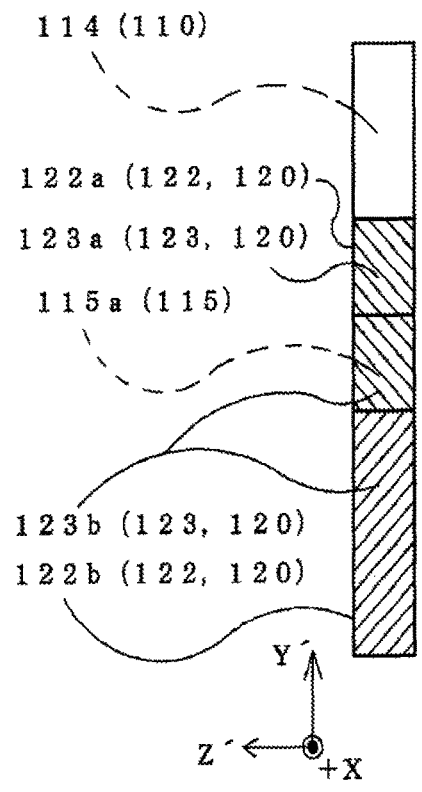
FIG. 4A is a plan view of the tuning fork type crystal element according to the first embodiment showing the side surface of the support part facing the opposite side to the vibrating parts.
Figure 4B:
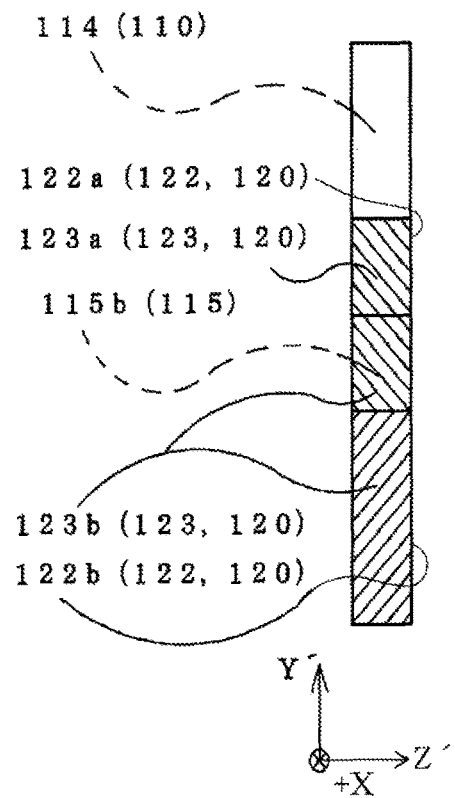
FIG. 4B is a plan view of the tuning fork type crystal element according to the first embodiment showing the side surface of the support part facing the vibrating parts.

The base part 111, as shown in FIG. 2 and FIGS. 3A and 3B, forms a substantially rectangular parallelepiped. Further, the major surfaces (surfaces perpendicular to Z'-axis) of the base part 111 becomes parallel with a plane which is obtained by rotating the plane parallel with the crystal axes of the X-axis and Y-axis by −5° to 5° around the X-axis. At this time, when looking at the crystal blank 110 by a planar view, a predetermined side of the base part 111 becomes parallel with the X-axis, while the sides which are connected to the predetermined side of the base part 111 become parallel with the Y'-axis.

Here, when using the tuning fork type crystal element according to the first embodiment for a crystal device 151 (FIG. 6), the surface of the base part 111 facing a board part 130a (see FIG. 6 and FIG. 7) is defined as the lower surface of the base part 111, while the surface of the base part 111 facing the side opposite to the lower surface of the base part 111 is defined as the upper surface of the base part 111. Further, the lower surface of the base part 111 and the upper surface of the base part 111 are defined as the major surfaces of the base part 111, while surfaces of the base part 111 which connect with the lower surface of the base part 111 and the upper surface of the base part 111 are defined as the side surfaces of the base part 111.

The vibrating parts 112 (112a, 112b) are provided so as to extend from the side surfaces of the base part 111 as shown in FIG. 2 and FIGS. 3A and 3B. At this time, the vibrating parts 112 extend from the side surfaces of the base part 111 parallel with the X-axis and Z'-axis in a direction parallel with the Y'-axis. The vibrating parts 112 form substantially rectangular shapes when looking at the crystal blank 110 by a planar view. Further, when looking at the crystal blank 110 by a planar view, the vibrating parts 112 have lengths of the sides of the vibrating parts 112 parallel with the Y'-axis becoming longer than the lengths of the sides of the vibrating parts 112 parallel with the X-axis.

Further, at the vibrating parts 112, at the front end parts, that is, at the end parts of the vibrating parts 112 at the sides opposite to the base part 111, hammer head-shaped weight parts 117 are provided. The weight parts 117 (117a, 117b) are for adjusting the frequency of bending vibration generated in the vibrating parts 112. Specifically, provision of the weight parts 117 enables approach to the state where the weights are provided at the front end sides of the vibrating parts 112, therefore the frequency of the bending vibration generated in the vibrating parts 112 can be made lower compared with a case where the weight parts 117 do not exist and thus the frequency of the bending vibration generated in the vibrating parts 112 is adjusted so as to become a desired frequency. Further, the weight parts 117 are configured by a first weight part 117a provided at the front end part of the first vibrating part 112a and a second weight part 117b provided at the front end part of the second vibrating part 112b.

Further, in the vibrating parts 112, groove parts 118 are formed in their major surfaces. For example, two groove parts 118 are provided at each of the upper surfaces of the vibrating parts 112 and the lower surfaces of the vibrating parts 112. The groove parts 118 have openings forming substantially rectangular shape. The sides of the groove parts 118 in the direction in which the vibrating parts 112 extend (direction parallel with the Y'-axis) become longer compared with the sides of the groove parts 118 in the direction vertical to the direction in which the vibrating parts 112 extend (direction parallel with the X-axis). Further, two groove parts 118 are positioned on a line in the direction vertical to the direction in which the vibrating parts 112 extend (direction parallel with the X-axis). Further, the groove parts 118 are configured by first groove parts 118a formed in the first vibrating part 112a and second groove parts 118*b* formed in the second vibrating part 112*b*. Note that, in the first embodiment, an explanation is given of the case where two groove parts 118 each are formed in the two major surfaces of the vibrating parts 112 on lines in a direction parallel with the X-axis. However, for example, one groove part 118 may be formed in each of the major surfaces of the vibrating parts 112 or may be formed in either of the upper surfaces of the vibrating parts 112 or the lower surfaces of the vibrating parts 112. Further, the case where the groove parts 118 form substantially rectangular shape openings is shown, but for example protruding parts for suppressing etching may be formed at the sides of the groove parts 118 parallel with the Y'-axis as well.

The vibrating parts 112, as shown in FIG. 2 and FIGS. 3A and 3B, are configured by the first vibrating part 112*a* and second vibrating part 112*b*. The two of the first vibrating part 112*a* and second vibrating part 112*b* are positioned on a line along a predetermined side of the base part 111 so that they become parallel with the X-axis by a planar view of the upper surface of the crystal blank 110. In the first vibrating part 112*a* and second vibrating part 112*b*, for example, when looking at the crystal blank 110 by a planar view, the first vibrating part 112*a* extends from the end part of the predetermined side of the base part 111 which is positioned on the +X side, while the second vibrating part 112*b* extends from the end part of the predetermined side of the base part 111 which is positioned on the −X side.

The first vibrating part 112*a* extends in the direction parallel with the Y'-axis from the side surface of the base part 111 parallel with the X-axis and Z'-axis at the end part on the +X side. Further, in the first vibrating part 112*a*, the first weight part 117*a* is provided at the front end part. The frequency of the bending vibration generated in the first vibrating part 112*a* is adjusted by the first weight part 117*a*. Further, in the first vibrating part 112*a*, two first groove parts 118*a* are formed from the root of the base part 111 up to the front end part of the first vibrating part 112*a* in each of the two major surfaces of the first vibrating part 112*a*, on a line so as to become parallel with the X-axis.

The second vibrating part 112*b* extends in the direction parallel with the Y'-axis from the side surface of the base part 111 parallel with the X-axis and Z'-axis at the end part on the −X side. Further, in the second vibrating part 112*b*, the second weight part 117*b* is provided at the front end part. The frequency of the bending vibration generated in the second vibrating part 112*b* is adjusted by the second weight part 117*b*. Further, in the second vibrating part 112*b*, two second groove parts 118*b* are formed from the root of the base part 111 up to the front end part of the second vibrating part 112*b* in each of the two major surfaces of the second vibrating part 112*b*, on a line so as to become parallel with the X-axis.

Here, where the tuning fork type crystal element according to the first embodiment is used in the crystal device 151, the surfaces of the vibrating parts 112 facing the upper surface of the board part 130*a* are defined as the lower surfaces of the vibrating parts 112, while the surfaces of the vibrating parts 112 facing the sides opposite to the lower sides of the vibrating part 112 are defined as the upper surfaces of the vibrating parts 112. Further, the upper surfaces of the vibrating parts 112 and the lower surfaces of the vibrating parts 112 are defined as the major surfaces of the vibrating parts 112, while the surfaces of the vibrating parts 112 connected with the upper surfaces of the vibrating parts 112 and with the lower surfaces of the vibrating parts 112 are defined as the side surfaces of the vibrating parts 112. Note, the front end faces of the vibrating parts 112 are excluded.

Figure 7:
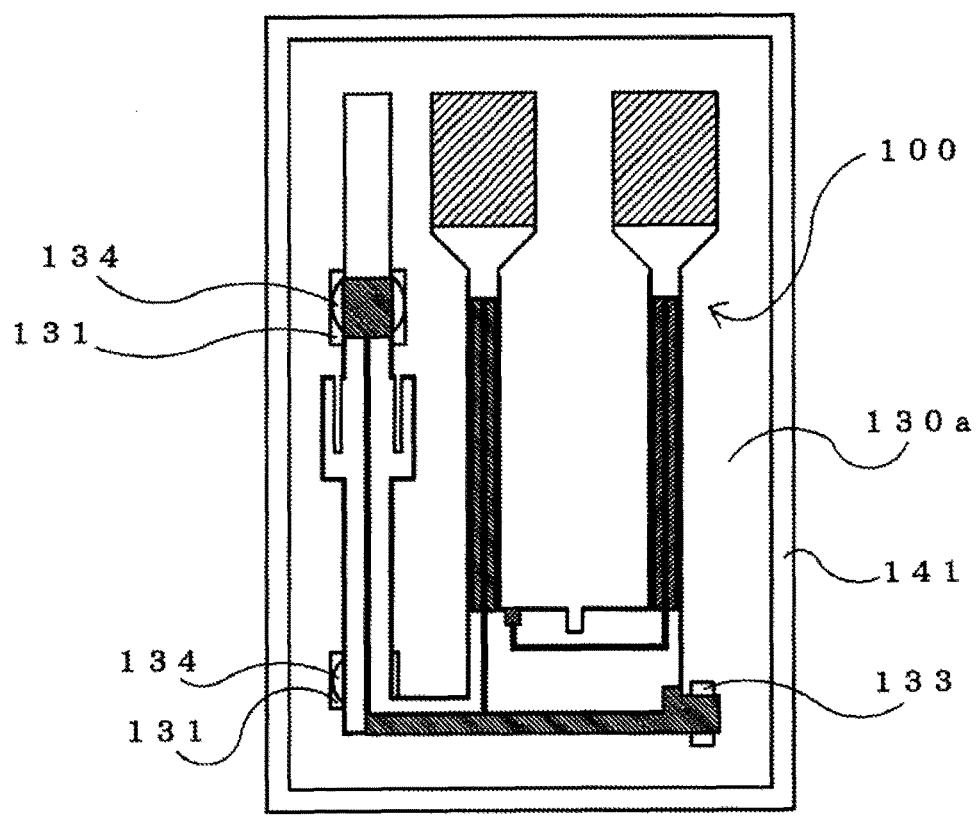
FIG. 7 is a plan view of the crystal device according to the first embodiment in a state where a lid member is detached.
Figure 8:
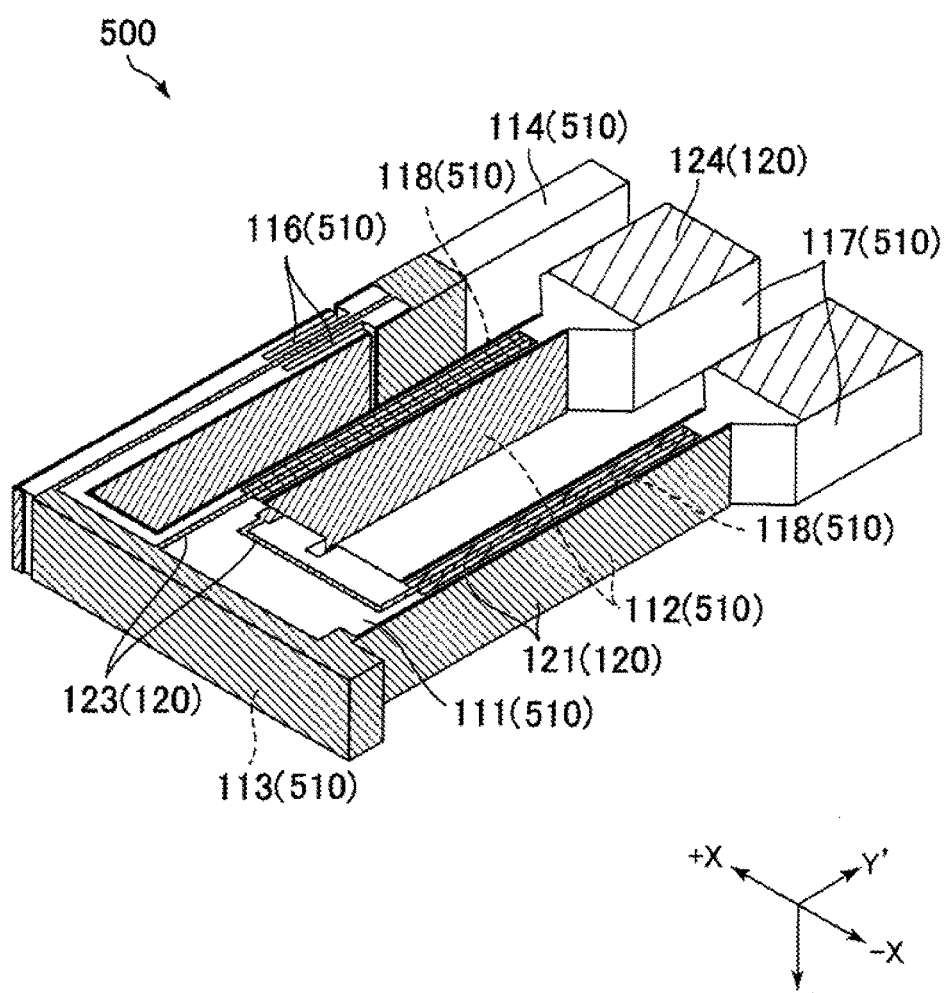
FIG. 8 is a perspective view of a tuning fork type crystal element according to a second embodiment.
Figure 9:
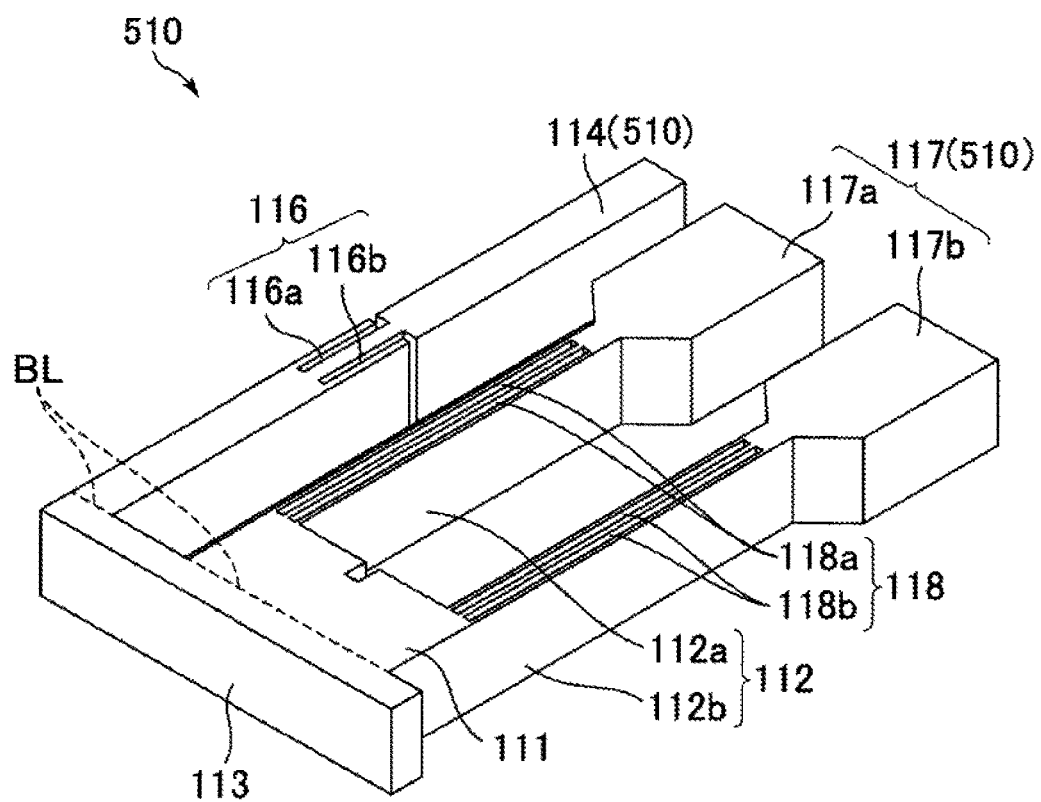
FIG. 9 is a perspective view of a crystal blank used in the tuning fork type crystal element according to the second embodiment.

The holding part 113, as shown in FIG. 6 and FIG. 7, when using the tuning fork type crystal element 100 according to the first embodiment in the crystal device 151, is for holding the vibrating parts 112 and the base part 111 together with the support part 114 and is for connecting the base part 111 and the support part 114. The holding part 113, as shown in FIG. 1 to FIGS. 3A and 3B, is provided so as to extend from the side surface of the base part 111 located at the position opposite to the side surface of the base part 111 from which the vibrating parts 112 extend. Accordingly, the holding part 113 extends outward from the surface between the two surfaces of the base part 111 parallel with the X-axis and Z'-axis from which the vibrating parts 112 do not extend.

The holding part 113 forms a substantially rectangular shape when looking at the crystal blank 110 by a planar view. At this time, the holding part 113 has long sides in the direction parallel with the X-axis. Note that, in the first embodiment, the explanation is given of the case where the holding part 113 has a rectangular shape. However, a slit or recess may be formed in the holding part 113 as well. By forming a slit or recess in the holding part 113 in this way, it becomes possible to reduce the influence of the support part 114 upon the vibrating parts 112.

As explained before, the holding part 113 is provided so as to extend outward from the side surface of the base part 111 located at the opposite position from the side surface of the base part 111 from which the vibrating parts 112 extend. From another viewpoint, the base part 111 can be said to extend from the side surface of the holding part 113 and, if looking at the crystal blank 110 by a planar view, to extend from one side of the holding part 113. At this time, if looking at the crystal blank 110 by a planar view, the base part 111 is positioned at one end part side of the one side of the holding part 113, specifically at the −X side end part side of the side of the holding part 113 parallel with the X-axis, inside from the end part. Accordingly, when looking at the crystal blank 110 by a planar view, in the holding part 113, the surface of the holding part 113 which is parallel with the Y'-axis and Z'-axis and is positioned on the −X side is not positioned on the same plane as the surface of the base part 111 which is parallel with the Y'-axis and Z'-axis and is positioned on the −X side, thus the holding part 113 protrudes from the base part 111. By doing this, when the tuning fork type crystal element 100 according to the first embodiment is used in the crystal device 151, when mounting the tuning fork type crystal element 100 according to the first embodiment on the upper surface of the board part 130*a* (see FIG. 6 and FIG. 7), contact of the vibrating parts 112 with the board part 130*a* can be reduced.

Here, when using the tuning fork type crystal element 100 according to the first embodiment in the crystal device 151, the surface of the holding part 113 which faces the board part 130*a* (see FIG. 6 and FIG. 7) is defined as the lower surface of the holding part 113, while the surface of the holding part 113 which faces the side opposite to the lower surface of the holding part 113 is defined as the upper surface of the holding part 113. Further, the upper surface of the holding part 113 and the lower surface of the holding part 113 are defined as the major surfaces of the holding part 113, while the surfaces connected with the upper surface of the holding part 113 and with the lower surface of the holding part 113 are defined as the side surfaces of the holding part 113.

The support part 114, as shown in FIG. 6 and FIG. 7, is for holding the vibrating parts 112 and base part 111 together with the holding part 113 when using the tuning fork type crystal element 100 according to the first embodiment in the crystal device 151. The support part 114, as shown in FIG. 1 to FIGS. 3A and 3B and FIG. 5, is provided so as to extend outward from the side surface of the holding part 113 to the same direction as the vibrating parts 112. The support part 114 for example extends in the direction parallel with the Y'-axis from the surface between the two surfaces of the holding part 113 parallel with the X-axis and Z'-axis from which the base part 111 extends. At this time, the support part 114 is positioned at the +X side from the base part 111. From another viewpoint, when looking at the crystal blank 110 by a planar view, all three of the first vibrating part 112a, second vibrating part 112b, and support part 114 are provided so as to become parallel with the Y'-axis and are arranged in an order of the support part 114, first vibrating part 112a, and second vibrating part 112b from the +X side. By providing such a support part 114, when a conductive adhesive 134 is provided on the lower surface of the support part 114 and lower surface of the holding part 113 and the tuning fork type crystal element 100 is used in the crystal device 151, contact of the vibrating parts 112 with the board part 130a (see FIG. 6 and FIG. 7) can be reduced since the support part 114 and base part 111 extend from the holding part 113 and further the vibrating parts 112 extend from the base part 111 to the same direction as the support part 114.

The protruding parts 115 (115a, 115b) are provided on the side surfaces of the support part 114 parallel with the direction in which the vibrating parts 112 extend. Accordingly, the protruding parts 115 extend from the side surfaces of the support part 114 parallel with the Y'-axis and Z'-axis. By doing this, when looking at the crystal blank 110 by a planar view, the length of the support part 114 in the direction vertical to the direction in which the support part 114 extends (direction parallel with the X-axis) becomes longer by exactly the parts where the protruding parts 115 are provided, therefore the mass 115 becomes larger in the protruding parts. Accordingly, by providing the protruding parts 115 on the side surfaces of the support part 114 parallel with the Y'-axis and Z'-axis in this way, the protruding parts 115 function as weights when a bending vibration is generated in the support part 114, so it becomes possible to reduce the bending vibration in the support part 114. For this reason, by doing this, degradation of frequency stability and degradation of electrical characteristics such as increase of equivalent series resistance, which occur since the bending vibration generated in the support part 114 and the bending vibration generated in the vibrating parts 112 exert influences upon each other, specifically, combine with each other, can be reduced. Further, the protruding parts 115 are configured by a first protruding part 115a and second protruding part 115b.

Further, in the protruding parts 115, cut away parts 116 (116a, 116b) are formed. The frequency of the bending vibration is related to the length parallel with the Y'-axis and the length parallel with the X-axis. Therefore, by forming the cut away parts 116 in the protruding parts 115 provided in the support part 114, spurious vibration which is generated due to the provision of the protruding parts 115 in the support part 114 can be reduced. That is, by forming the cut away parts 116 in the protruding parts 115, it is possible to reduce the spurious vibration generated due to the provision of the protruding parts 115 while reducing the bending vibration generated in the support part 114 and possible to reduce degradation of the electrical characteristics. Further, the cut away parts 116 are configured by the first cut away part 116a formed in the first protruding part 115a and the second cut away part 116b formed in the second protruding part 115b.

In the tuning fork type crystal element 100 according to the first embodiment, by providing the protruding parts 115 having the cut away parts 116 formed therein on the surfaces of the support part 114 which are parallel with the Y'-axis and Z'-axis, the bending vibration generated in the support part 114 is reduced while the frequency of the bending vibration generated in the support part 114 is prevented from becoming lower than the bending vibration generated in the vibrating parts 112 and therefore degradation of the electrical characteristics is reduced.

Further, in the tuning fork type crystal element 100 according to the first embodiment, when looking at the crystal blank 110 by a planar view, the protruding parts 115 form substantially rectangular shapes and the cut away parts 116 are formed in the surfaces of the protruding parts 115 parallel with the side surface of the holding part 113 from which the support part 114 extends. That is, when looking at the crystal blank 110 by a planar view, the substantially block-shaped protruding parts 115 extend in the direction parallel with the X-axis from the surface of the support part 114 parallel with the Y'-axis and Z'-axis, and the cut away parts 116 are formed in the surfaces of the protruding parts 115 parallel with the X-axis and the Z'-axis. By doing this, the lengths in the direction parallel with the Y'-axis in the protruding parts 115 having the cut away parts 116 formed therein and the lengths in the direction parallel with the X-axis in the protruding parts 115 having the cut away parts 116 formed therein can be easily measured, therefore calculation of the frequency of the bending vibration generated in the support part 114 can be made easier compared with the case where the protruding parts 115 which do not form substantially block shapes are provided. Further, by forming the cut away parts 116 in the surfaces of the protruding parts 115 forming rectangular shapes parallel with the Z'-axis and X-axis in this way, compared with the case where the cut away parts 116 are formed in the surfaces of the protruding parts 115 parallel with the Y'-axis and Z'-axis, even if etching residue is generated, the shape of the first protruding part 115a having the first cut away part 116a formed therein and the shape of the second protruding part 115b having the second cut away part 116b formed therein can be made almost the same, therefore it becomes possible to facilitate the calculation of the frequency of bending vibration generated in the support part 114.

Figure 5:
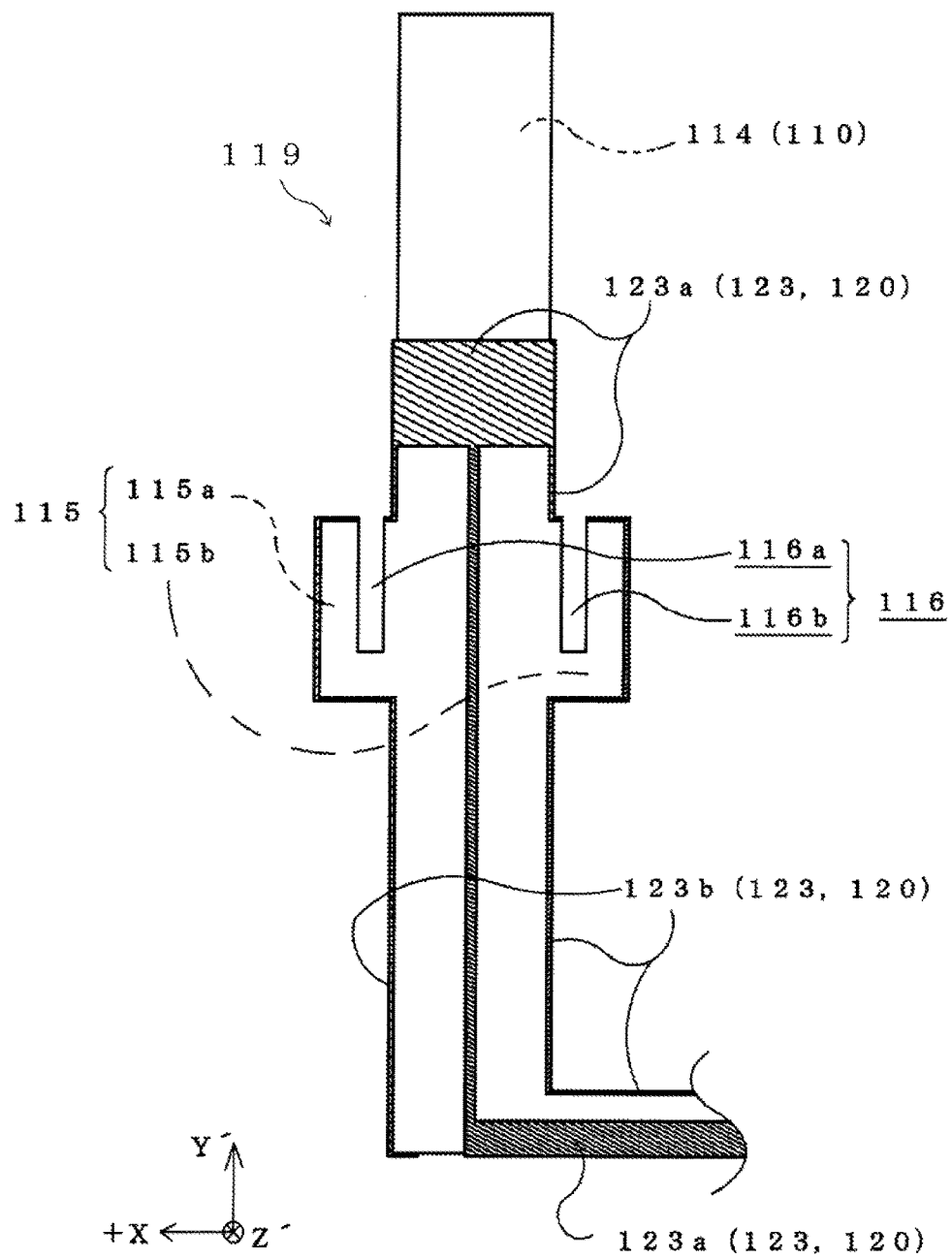
FIG. 5 is a partially enlarged view of the support part of the tuning fork type crystal element according to the first embodiment.

Further, from another viewpoint, as shown in FIG. 5, when looking at the crystal blank 110 by a planar view, the protruding parts 115 having the cut away parts 116 formed therein may be said to have right angle protruding parts of shapes (L-shapes) extending from the support part 114 to the X-axis direction and further extending at right angles from the end parts in the Y'-axis direction. By doing this, when metal patterns 120 are provided on the side surfaces of the support part 114 by sputtering or vapor deposition, the parts which extend in the Y'-axis direction become concealed. Therefore, it becomes possible to prevent short-circuiting of the metal patterns 120 between the holding part 113 sides in the protruding parts 115 having the cut away parts 116 formed therein and the free end sides in the protruding parts 115 having the cut away parts 116 formed therein. Further, by doing this, compared with the case where the cut away parts 116 are formed in the surfaces of the protruding parts 115 parallel with the Y'-axis and Z'-axis, even if etching residue is generated, the shape of the first protruding part 115a having the first cut away part 116a formed therein and the shape of the second protruding part 115b having the second cut away part 116b formed therein can be made almost the same, therefore it becomes possible to prevent short-circuiting of metal patterns 120 more reliably.

Further, when looking at the crystal blank 110 by a planar view, the protruding parts 115 have the right angle protruding parts of shapes extending from the support part 114 to the X-axis directions and further extend from the end parts thereof at right angles in the Y'-axis direction, therefore the bending vibration of the support part 114 generated in the X-axis direction can be attenuated with a high efficiency by the protruding parts 115 having the cut away parts 116 formed therein, so it becomes possible to reduce the bending vibration generated in the support part 114 more.

At this time, the cut away parts 116 are formed in the surfaces of the protruding parts 115 which face the opposite side from the holding part 113. By doing this, compared with a case where the cut away parts 116 are formed in the surfaces of the protruding parts 115 which face the holding part 113 side, the quantity of the etching residue generated between the protruding parts 115 and the support part 114 can be increased. Accordingly, it becomes possible to reduce the bending vibration generated in the holding part 113 more.

Further, by doing this, looking at the crystal blank 110 by a planar view, etching residue can be generated on the surfaces on the holding part 113 side in the protruding parts 115 having the cut away parts 116 formed therein, therefore the function can be made to approach a state where a weight is attached to the holding part 113 side in the support part 114, so the drop of the frequency of bending vibration generated in the support part 114 relative to the frequency of bending vibration generated in the vibrating parts 112 can be reduced. This is, in general, in the case of a tuning fork, the same phenomenon as the phenomenon where the frequency of the tuning fork arm becomes higher in the case where a weight is attached to the free end side of the tuning fork arm between the case where a weight is attached to the root side of the tuning fork arm and the case where a weight is attached to the free end side of the tuning fork arm.

Further, in the case where the tuning fork type crystal element 100 according to the first embodiment is mounted by using the side nearer the front end of the support part 114 from the protruding parts 115 having the cut away parts 116 formed therein, by generating etching residue on the surfaces on the holding part 113 side in the protruding parts 115 having the cut away parts 116 formed therein, stress applied due to mounting can be gradually attenuated in the etching residue part, therefore it becomes possible to reduce the influence upon the vibrating parts 112.

Further, in the tuning fork type crystal element 100 according to the first embodiment, when looking at the crystal blank 110 by a planar view, the lengths of the protruding parts 115 parallel with the direction in which the support part 114 extends become 10% to 25% of the length of the support part 114 parallel with the direction in which the support part 114 extends. When the lengths of the protruding parts 115 parallel with the direction in which the support part 114 extends are less than 10% of the length of the support part 114 parallel with the direction in which the support part 114 extends, the protruding parts 115 having the cut away parts 116 formed therein become small, therefore the effect of reducing the bending vibration generated in the support part 114 becomes weak. When the lengths of the protruding parts 115 parallel with the direction in which the support part 114 extends are larger than 25% of the length of the support part 114 parallel with the direction in which the support part 114 extends, the protruding parts 115 having the cut away parts 116 formed therein become large, therefore the frequency of bending vibration generated in the support part 114 is liable to become lower than the frequency of bending vibration generated in the vibrating parts 112. For this reason, when looking at the crystal blank 110 by a planar view, by setting the lengths of the protruding parts 115 parallel with the direction in which the support part 114 extends to 10% to 25% of the length of the support part 114 parallel with the direction in which the support part 114 extends, the bending vibration generated in the support part 114 is reduced while reducing the probability of the drop in the frequency of bending vibration generated in the support part 114 below the frequency of bending vibration generated in the vibrating parts 112. As a result, degradation of the electrical characteristics of the tuning fork type crystal element according to the first embodiment is reduced more.

At this time, looking at the crystal blank 110 by a planar view, the lengths of the cut away parts 116 parallel with the direction in which the support part 114 extends become 40% to 90% of the lengths of the protruding parts 115 parallel with the direction in which the support part 114 extends. By looking at the crystal blank 110 by a planar view, in a case where the lengths of the cut away parts 116 parallel with the direction in which the support part 114 extends are less than 40% of the lengths of the protruding parts 115 parallel with the direction in which the support part 114 extends, due to the etching residue generated in the cut away parts 116, when the metal patterns 120 are provided on the side surfaces of the support part 114 by sputtering or vapor deposition, the parts which extend in the Y'-axis direction do not become concealed, therefore the metal patterns 120 are liable to cause short-circuiting between the holding part 113 sides in the protruding parts 115 having the cut away parts 116 formed therein and the free end sides in the protruding parts 115 having the cut away parts 116 formed therein. Looking at the crystal blank 110 by a planar view, when the lengths of the cut away parts 116 parallel with the direction in which the support part 114 extends are larger than 90% of the lengths of the protruding parts 115 parallel with the direction in which the support part 114 extends, when the support part 114 receives bending vibration, the tuning fork type crystal element 100 is liable to break. For this reason, looking at the crystal blank 110 by a planar view, the lengths of the cut away parts 116 parallel with the direction in which the support part 114 extends are set to 40% to 90% of the lengths of the protruding parts 115 parallel with the direction in which the support part 114 extends. By setting the lengths in this way, the probability of short-circuiting of metal patterns 120 can be reduced between the holding part 113 sides in the protruding parts 115 having the cut away parts 116 formed therein and the free end sides in the protruding parts 115 having the cut away parts 116 formed therein, and the probability of breakage of the tuning fork type crystal element 100 can be reduced.

Further, in the tuning fork type crystal element 100 according to the first embodiment, the crystal blank 110 is provided with the weight parts 117 at the end parts of the vibrating parts 112 on the sides opposite to the base part 111. When looking at the crystal blank 110 by a planar view, the protruding parts 115 having the cut away parts 116 formed therein are positioned at the holding part 113 sides from the weight parts 117 and are positioned at the weight part 117 sides from the base part 111. By setting the positions of the protruding parts 115 having the cut away parts 116 formed therein to the weight part 117 sides from the base part 111 in this way, the distances from the protruding parts 115 having the cut away parts 116 formed therein to the vibrating parts 112 can be made longer, therefore the influence of the protruding parts 115 having the cut away parts 116 formed therein upon the bending vibration generated in the vibrating parts 112 can be reduced. Further, by setting the positions of the protruding parts 115 having the cut away parts 116 formed therein to the holding part 113 sides from the weight parts 117, when the vibrating parts 112 and support part 114 receive bending vibration, contact of the weight parts 117 with the protruding parts 115 having the cut away parts 116 formed therein can be reduced. Accordingly, when looking at the crystal blank 110 by a planar view, by forming the protruding parts 115 so that they are positioned at the holding part 113 sides from the weight parts 117 and are positioned on the weight part 117 sides from the base part 111, it becomes possible to reduce degradation of electrical characteristics of the tuning fork type crystal element 100 according to the first embodiment.

The first protruding part 115a having the first cut away part 116a formed therein forms a substantially rectangular parallelepiped and protrudes from the side surface of the support part 114 parallel with the Y'-axis and Z'-axis toward the +X-axis direction. At this time, the first cut away part 116a is formed in the surface of the first protruding part 115 parallel with the X-axis and Z'-axis facing the opposite side to the holding part 113.

The second protruding part 115b having the second cut away part 116b formed therein forms a substantially rectangular parallelepiped and protrudes from the side surface of the support part 114 parallel with the Y'-axis and Z'-axis toward the —X-axis direction. Further, the second protruding part 115b having the second cut away part 116b formed therein, when looking at the crystal blank 110 by a planar view, is arranged so that it becomes schematically line symmetric together with the first protruding part 115a having the first cut away part 116a formed therein with respect to the center line passing through the center of the support part 114 parallel with the direction in which the support part 114 extends, that is, the direction parallel with the Y'-axis. Here, the term "schematically line symmetric" shows a state becoming line symmetric if considering no inclusion of etching residue. The second cut away part 116b is formed in the surface parallel with the X-axis and Z'-axis facing the opposite side to the holding part 113.

Here, the size of the crystal blank 110 when looking at the crystal blank 110 by a planar view will be explained. In the base part 111, the length in the direction parallel with the X-axis becomes 250 to 350 µm, and the length in the direction parallel with the Y'-axis becomes 80 to 150 µm. In the vibrating parts 112, the lengths in the directions parallel with the Y'-axis become 430 to 550 µm, and the lengths in the directions parallel with the X-axis become 20 to 55 µm. Here, the lengths in the directions parallel with the Y'-axis in the vibrating parts 112 mean the lengths not including the weight parts 117. In the holding part 113, the length in the direction parallel with the X-axis becomes 380 to 600 µm, and the length in the direction parallel with the Y'-axis becomes 35 to 60 µm. In the support part 114, the length in the direction parallel with the X-axis becomes 50 to 120 µm, and the length in the direction parallel with the Y'-axis becomes 745 to 1010 µm. In the first protruding part 115a and second protruding part 115b, the lengths in the directions parallel with the X-axis become 20 to 40 µm. The lengths in the directions parallel with the Y'-axis become 74.5 to 252.5 µm. In the first cut away part 116a and second cut away part 116b, the lengths in the directions parallel with the X-axis become 5 to 20 µm, and the lengths in the directions parallel with the Y'-axis become 22.35 to 227.25 µm. Note that, the length in the direction parallel with the Z'-axis in the crystal blank 110, that is, the thickness in the vertical direction of the crystal blank 110, becomes 50 to 200 µm.

(Configuration of Metal Patterns)

The metal patterns 120 are for applying voltage to the crystal blank 110 and are provided on the crystal blank 110. The metal patterns 120, as shown in FIG. 1 to FIG. 5, are comprised of excitation electrode parts 121 (121a, 121b), terminal parts 122 (122a, 122b), wiring parts 123 (123a, 123b), and frequency adjustment parts 124.

The excitation electrode parts 121 (121a, 121b), as shown in FIG. 1 and FIGS. 3A and 3B, are provided on the upper surfaces, lower surfaces, and side surfaces of the vibrating parts 112 (112a, 112b) and are for causing bending vibration at the vibrating parts 112. The excitation electrode parts 121 have multilayer structures comprised of, for example, a metal layer selected from any one of chrome, titanium, Nichrome, and nickel on which a metal layer selected from any of gold, silver, palladium, a metal containing gold as the principal ingredient, a metal containing silver as the principal ingredient, and a metal containing palladium as the principal ingredient is laminated. Pairs of excitation electrode parts 121 are provided. The pairs are configured by first excitation electrode parts 121a and second excitation electrode parts 121b.

The first excitation electrode parts 121a, as shown in FIGS. 3A and 3B, are provided on the two major surfaces of the first vibrating part 112a and on side surfaces of the second vibrating part 112b parallel with the Y'-axis and Z'-axis. At this time, the first excitation electrode parts 121a provided on the two major surfaces of the first vibrating part 112a are provided at positions facing each other. Further, the first excitation electrode parts 121a provided on the side surfaces of the second vibrating part 112b parallel with the Y'-axis and Z'-axis are provided at positions facing each other.

The second excitation electrode parts 121b, as shown in FIGS. 3A and 3B, are provided on the two major surfaces of the second vibrating part 112b and on the side surfaces of the first vibrating part 112a parallel with the Y'-axis and Z'-axis. At this time, the second excitation electrode parts 121b provided on the side surfaces of the first vibrating part 112a parallel with the Y'-axis and Z'-axis are provided at positions facing each other. Further, the second excitation electrode parts 121b provided on the two major surfaces of the second vibrating part 112b are provided at positions facing each other.

The terminal parts 122 (122a, 122b) are for applying voltage to the excitation electrode parts 121 from the outside of the tuning fork type crystal element 100 according to the first embodiment. Accordingly, when using the tuning fork type crystal element 100 according to the first embodiment in the crystal device 151, the terminal parts 122 are electrically adhered by the conductive adhesive 134 (see FIG. 7) to the connection pads 131 (see FIG. 6 and FIG. 7) provided on the upper surface of the board part 130a (see FIG. 6 and FIG. 7). The terminal parts 122 have multilayer structures comprised of, for example, a metal layer selected from any one of chrome, titanium, Nichrome, and nickel on which a metal layer selected from any of gold, silver, palladium, a metal containing gold as the principal ingredient, a metal containing silver as the principal ingredient, and a metal containing palladium as the principal ingredient is laminated. A pair of terminal parts 122 are provided. The pair is configured by the first terminal part 122a and second terminal part 122b.

The first terminal part 122a, as shown in FIGS. 3A and 3B, is provided on the lower surface of the support part 114 on the front end side from the protruding parts 115 having the cut away parts 116 formed therein. At this time, when looking at the lower surface of the tuning fork type crystal element 100 according to the first embodiment by a planar view, the first terminal part 122a is positioned at the holding part 113 side from the end part of the weight part 117 at the holding part 113 side. The first terminal part 122a is electrically connected through first wiring parts 123a to the first excitation electrode parts 121a.

The second terminal part 122b, as shown in FIGS. 3A and 3B, is provided on the lower surface of the holding part 113 and support part 114 (at least one of them) at the end parts on the side where the two are connected. Accordingly, when looking at the lower surface of the tuning fork type crystal element 100 according to the first embodiment by a planar view, the second terminal part 122b is positioned from the end part on the +X side in the holding part 113 up to the end part on the holding part 113 side in the support part 114. The second terminal part 122b is electrically connected through second wiring parts 123b to the second excitation electrode parts 121b.

From another viewpoint, when looking at the lower surface of the tuning fork type crystal element 100 according to the first embodiment by a planar view, the protruding parts 115 having the cut away parts 116 formed therein may be said to be extended from the side surfaces of the support part 114 between the first terminal part 122a and the second terminal part 122b. By doing this, when using the tuning fork type crystal element 100 according to the first embodiment in the crystal device 151, even if contraction stress generated at the time of shrinkage of the conductive adhesives 134 (see FIG. 6 and FIG. 7) adhered to the first terminal part 122a and the second terminal part 122b is applied to the support part 114, the rigidity becomes stronger by the amount of provision of the protruding parts 115 having the cut away parts 116 formed therein, therefore breakage of the support part 114 due to contraction stress can be reduced.

The wiring parts 123 (123a, 123b) are for electrically connecting the excitation electrode parts 121 and the terminal parts 122 and connecting the facing excitation electrode parts 121. The wiring parts 123 form multilayer structures of, for example, a metal layer selected from any one of chrome, titanium, Nichrome, and nickel on which a metal layer selected from any one of gold, silver, palladium, a metal containing gold as the principal ingredient, a metal containing silver as the principal ingredient, and a metal containing palladium as the principal ingredient is laminated. The wiring parts 123 are configured by the first wiring parts 123a and second wiring parts 123b.

The first wiring parts 123a, as shown in FIG. 1, FIGS. 3A and 3B, and FIGS. 4A and 4B, are for electrically connecting the first excitation electrode parts 121a and the first terminal part 122a and connecting the first excitation electrode parts 121a. As shown in FIGS. 3A and 3B, when looking at the side surface of the support part 114 by a planar view, parts of the first wiring parts 123a are provided on the side surface of the support part 114 from the end parts of the protruding parts 115 having the cut away parts 116 formed therein on the free end sides up to the first terminal part 122a. Accordingly, the surfaces of the protruding parts 115 having the cut away parts 116 formed therein parallel with the Y'-axis and Z'-axis are not provided with parts of the first wiring parts 123a. Further, when looking at the upper surface of the tuning fork type crystal element 100 according to the first embodiment by a planar view, parts of the first wiring parts 123a are provided at the central part of the support part 114 so as to become parallel with the direction in which the support part 114 extends. Further, parts of the first wiring parts 123a are provided on the lower surface of the second vibrating part 112b between the second excitation electrode parts 121b and the weight part 117 in order to electrically connect the first excitation electrode parts 121a provided on the side surfaces of the second vibrating part 112b parallel with the Y'-axis and Z'-axis. Further, parts of the first wiring parts 123a are provided on the two major surfaces of the base part 111 and the two major surfaces of the holding part 113.

The second wiring parts 123b, as shown in FIG. 1, FIGS. 3A and 3B, and FIGS. 4A and 4B, electrically connect the second excitation electrode parts 121b and the second terminal part 122b and connect the second excitation electrode parts 121b. As shown in FIGS. 3A and 3B, when looking at the side surface of the support part 114 by a planar view, parts of the second wiring parts 123b are provided from the protruding parts 115 having the cut away parts 116 formed therein up to the end part of the support part 114 on the holding part 113 side. Accordingly, parts of the second wiring parts 123b are provided on the surfaces of the protruding parts 115 having the cut away parts 116 formed therein parallel with the Y'-axis and Z'-axis. Further, in order to electrically connect the second excitation electrode parts 121b provided on the side surfaces of the first vibrating part 112a parallel with the Y'-axis and Z'-axis, parts of the second wiring parts 123b are provided on the lower surface of the first vibrating part 112a between the first excitation electrode parts 121a and the weight part 117. Further, parts of the second wiring parts 123b are provided on the two major surfaces of the base part 111 and on the two major surfaces of the holding part 113.

The first wiring parts 123a and the second wiring parts 123b are divided into the first wiring parts 123a and second wiring parts 123b by the cut away parts 116 of the protruding parts 115 having the cut away parts 116 formed therein. The first wiring parts 123a and second wiring parts 123b are not provided on the inner wall surfaces of the cut away parts 116. By doing this, by providing the cut away parts 116, generation of an electric field in the protruding parts 115 having the cut away parts 116 formed therein and generation of bending vibration due to an inverse piezoelectric effect and piezoelectric effect are reduced.

The frequency adjustment parts 124 are for finely adjusting the frequency of the bending vibration generated in the vibrating parts 112 by increasing or decreasing the quantity of the metal forming the frequency adjustment parts 124. The frequency adjustment parts 124, as shown in FIG. 1 and FIGS. 3A and 3B, are provided in the weight parts 117. They are for example provided on the upper surfaces of the weight parts 117 and on the front end sides of the weight parts 117. The frequency adjustment parts 124 form multilayer structures of, for example, a metal layer selected from any one of chrome, titanium, Nichrome, and nickel on which a metal layer selected from any one of gold, silver, palladium, a metal containing gold as the principal ingredient, a metal containing silver as the principal ingredient, and a metal containing palladium as the principal ingredient is laminated. Note that, the case where the frequency adjustment parts 124 had multilayer structures was explained, but the frequency adjustment parts 124 may also have single-layer structures, for example, may be metal layers selected from any one of chrome, titanium, aluminum, gold, silver, a metal layer containing gold as the principal ingredient, and a metal layer containing silver as the principal ingredient.

(Operation of Tuning Fork Type Crystal Element)

Here, the operating principle of the tuning fork type crystal element 100 according to the first embodiment will be explained. When applying voltage to the terminal parts 122 (122a, 122b) of the tuning fork type crystal element 100 according to the first embodiment, through the wiring parts 123, electrical charges are stored in the excitation electrode parts 121. At this time, charges having opposite polarities are stored in the first excitation electrode parts 121a and in the second excitation electrode parts 121b. Therefore, an electric field is generated from the excitation electrode part 121 side in which plus charges are stored to the excitation electrode part 121 side in which minus charges are stored, and contraction (distortion) is generated in the vibrating parts 112 due to the inverse piezoelectric effect, so the vibrating parts 112 bend (deform). As a result, the vibrating parts 112 try to return to their original states. Therefore, due to the piezoelectric effect, charges having a polarity opposite to that of the charges stored first are stored in the vibrating parts 112. For example, in a case where plus charges are stored in the first excitation electrode parts 121a and minus charges are stored in the second excitation electrode parts 121b at first, due to the inverse piezoelectric effect and piezoelectric effect, minus charges are stored in the first excitation electrode parts 121a and plus charges are stored in the second excitation electrode parts 121b. That is, by applying alternating voltage to the terminal parts 122, alternating voltage will be applied to the excitation electrode parts 121. Therefore, due to the inverse piezoelectric effect and piezoelectric effect, the vibrating parts 112 end up causing bending vibration. Accordingly, when alternating voltage is applied to the terminal parts 122, different charges are alternately stored in the excitation electrode parts 121 and the vibrating parts 112 alternately bend, therefore the vibrating parts 112 can be made to cause bending vibration. It becomes possible to adjust the frequency of bending vibration generated in the vibrating parts 112 by the weight parts 117 provided at the front end parts of the vibrating parts 112 and the frequency adjustment parts 124 provided on the weight parts 117.

The tuning fork type crystal element 100 according to the first embodiment is comprised of the crystal blank 110 including the substantially rectangular parallelepiped shaped base part 111, vibrating parts 112 which are provided so as to extend from the side surface of the base part 111, the substantially rectangular shaped holding part 113 which is provided so as to extend from the side surface located at the position opposite to the side surface of the base part 111, the support part 114 which is provided so as to extend from the side surface of the holding part 113 in a direction the same as the vibrating parts 112 (direction parallel with the Y'-axis), the pair of protruding parts 115 which are provided on the side surfaces of the support part 114 (the surfaces of the support part 114 which are parallel with the Y'-axis and Z'-axis) parallel with the direction in which the vibrating parts 112 extend, and the cut away parts 116 which are formed in the side surfaces of the protruding parts 115 and is comprised of metal patterns 120 including the pair of excitation electrode parts 121 which are provided on the vibrating parts 112, the pair of terminal parts 122 which are provided on the lower surfaces of the support part 114 and holding part 113, and the wiring parts 123 which electrically connect the excitation electrode parts 121 and the terminal parts 122.

By providing the protruding parts 115 (115a, 115b) on the side surfaces of the support part 114 parallel with the direction in which the vibrating parts 112 extend in this way, when looking at the crystal blank 110 by a planar view, the length of the support part 114 in the direction vertical to the direction in which the support part 114 extends (direction parallel with the X-axis) can be made longer by the amount of provision of the protruding parts 115, therefore it becomes possible to increase the mass in the protruding parts 115. Accordingly, the protruding parts 115 perform the functions of weights where a bending vibration is generated in the support part 114, so it becomes possible to reduce the bending vibration in the support part 114. For this reason, degradation of frequency stability and degradation of electrical characteristics such as increase of the equivalent series resistance which occur since the bending vibration generated in the support part 114 and the bending vibration generated in the vibrating parts 112 exert influences upon each other, specifically are combined, can be reduced.

Further, by forming the cut away parts 116 in the protruding parts 115, fall of the frequency of the bending vibration generated in the support part 114 to a level lower than the frequency of the bending vibration generated in the vibrating part 112 due to the provision of the protruding parts 115 on the support part 114 is reduced. That is, in the tuning fork type crystal element 100 according to the first embodiment, by providing the protruding parts 115 having the cut away parts 116 formed therein on the surfaces of the support part 114 parallel with the Y'-axis and Z'-axis, the frequency of the bending vibration generated in the support part 114 is prevented from falling to a level lower than that of the bending vibration generated in the vibrating part 112 while reducing the bending vibration generated in the support part 114 and thereby reducing degradation of electrical characteristics.

Further, in the tuning fork type crystal element 100 according to the first embodiment, looking at the crystal blank 110 by a planar view, the protruding parts 115 form substantially rectangular shapes and the cut away parts 116 are formed in the surfaces of the protruding parts 115 parallel with the side surface of the holding part 113 from which the support part 114 extends. From another viewpoint, in the tuning fork type crystal element 100 according to the first embodiment, when looking at the crystal blank 110 by a planar view, it can be said that the substantially rectangular parallelepiped shaped protruding parts 115 extend in a direction parallel with the X-axis from the surfaces of the support part 114 parallel with the Y'-axis and Z'-axis, and the cut away parts 116 are formed in the surfaces of these protruding parts 115 parallel with the X-axis and Z'-axis. By doing this, it becomes possible to easily measure the lengths of the protruding parts 115 having the cut away parts 116 formed therein parallel with the Y'-axis and the lengths of the protruding parts 115 having the cut away parts 116 formed therein parallel with the X-axis, therefore the frequency of the bending vibration generated in the support part 114 can be easily calculated compared with the case where protruding parts 115 which not having substantially rectangular parallelepiped shapes are provided. Further, by forming the cut away parts 116 in the surfaces of the protruding parts 115 exhibiting the rectangular shape parallel with the Z'-axis and X-axis in this way, compared with the case of forming the cut away parts 116 in the surfaces of the protruding parts 115 parallel with the Y'-axis and Z'-axis, even if etching residue is generated, the shapes of the first protruding part 115a having the first cut away part 116a formed therein and the second protruding part 115b having the second cut away part 116b formed therein can be made almost the same, therefore it becomes possible to facilitate the calculation of the frequency of the bending vibration generated in the support part 114.

Further, in the tuning fork type crystal element 100 according to the first embodiment, when looking at the crystal blank 110 by a planar view, the protruding parts 115 having the cut away parts 116 formed therein may have right angle protruding parts of shapes extending outward from the support part 114 to the X-axis direction and further extending from the front end part thereof at a right angle to the Y'-axis direction. By doing this, when proving the metal patterns 120 on the side surfaces of the support part 114 by sputtering or vapor deposition, the parts which extend to the Y'-axis direction become concealed, therefore it becomes possible to prevent short-circuiting of metal patterns 120 from occurring between the holding part 113 sides in the protruding parts 115 having the cut away parts 116 formed therein and the free end sides in the protruding parts 115 having the cut away parts 116 formed therein. Further, by doing this, compared with the case where the cut away parts 116 are formed in the surfaces of the protruding parts 115 parallel with the Y'-axis and Z'-axis, even if etching residue is generated, the shapes of the first protruding part 115a having the first cut away part 116a formed therein and the second protruding part 115b having the second cut away part 116b formed therein can be made almost the same, therefore it becomes possible to more reliably prevent short-circuiting of metal patterns 120.

Further, when looking at the crystal blank 110 by a planar view, since right angle protruding parts of shapes extending from the support part 114 toward the x-axis directions and further extending at right angles from the front end parts thereof to the Y'-axis direction are formed, bending vibration of the support part 114 generated in the X-axis direction can be attenuated with a high efficiency by the protruding parts 115 having the cut away parts 116 formed therein, so it becomes possible to reduce the bending vibration generated in the support part 114 more.

Further, in the tuning fork type crystal element 100 according to the first embodiment, the cut away parts 116 are formed in the surfaces of the protruding parts 115 which face the opposite side from the holding part 113. By doing this, compared with the case where the cut away parts 116 are formed in the surfaces of the protruding parts 115 which face the holding part 113 sides, the quantity of the etching residue generated between the protruding parts 115 and the support part 114 can be increased. Accordingly, it becomes possible to reduce the bending vibration generated in the support part 114 more.

Further, by doing this, looking at the crystal blank 110 by a planar view, the etching residue can be generated on the surfaces of the protruding parts 115 having the cut away parts 116 formed therein on the holding part 113 side, therefore it is possible to approach a state where a weight is attached to the holding part 113 side in the support part 114, so fall of the frequency of the bending vibration generated in the support part 114 to a low level relative to the frequency of the bending vibration generated in the vibrating part 112 can be reduced.

Further, when looking at the crystal blank 110 by a planar view, by generating etching residue on the surface of the protruding part 115 having the cut away part 116 formed therein on the holding part 113 side, when mounting the tuning fork type crystal element 100 according to the first embodiment at the front end side of the support part 114 from the protruding parts 115 having the cut away parts 116 formed therein, the stress applied due to the mounting can be gradually attenuated in the etching residue part, therefore it becomes possible to reduce the influence upon the vibrating parts 112.

Further, in the tuning fork type crystal element 100 according to the first embodiment, when looking at the crystal blank 110 by a planar view, the lengths of the protruding parts 115 parallel with the direction in which the support part 114 extends (the lengths of the protruding parts 115 in the direction parallel with the Y'-axis) becomes 10% to 25% of the length of the support part 114 parallel with the direction in which the support part 114 extends (the length of the support part 114 in the direction parallel with the Y'-axis). When the lengths of the protruding parts 115 parallel with the direction in which the support part 114 extends are less than 10% of the length of the support part 114 parallel with the direction in which the support part 114 extends, the protruding parts 115 having the cut away parts 116 formed therein become small, therefore the effect of reducing the bending vibration generated in the support part 114 becomes weak. When the lengths of the protruding parts 115 parallel with the direction in which the support part 114 extends are larger than 25% of the length of the support part 114 parallel with the direction in which the support part 114 extends, the protruding parts 115 having the cut away parts 116 formed therein become large, therefore the frequency of bending vibration generated in the support part 114 is liable to become lower than the frequency of bending vibration generated in the vibrating parts 112. For this reason, when looking at the crystal blank 110 by a planar view, by setting the lengths of the protruding parts 115 parallel with the direction in which the support part 114 extends to 10% to 25% of the length of the support part 114 parallel with the direction in which the support part 114 extends, the bending vibration generated in the support part 114 is reduced while reducing the probability of the drop in the frequency of bending vibration generated in the support part 114 below the frequency of bending vibration generated in the vibrating parts 112. As a result, degradation of electrical characteristics of the tuning fork type crystal element according to the first embodiment is reduced more.

Further, in the tuning fork type crystal element 100 according to the first embodiment, when looking at the crystal blank 110 by a planar view, the lengths of the cut away parts 116 parallel with the direction in which the support part 114 extends (the lengths of the cut away parts 116 parallel with the Y'-axis) become 40% to 90% of the lengths of the protruding parts 115 parallel with the direction in which the support part 114 extends (the lengths of the protruding parts 115 parallel with the Y'-axis). By looking at the crystal blank 110 by a planar view, in a case where the lengths of the cut away parts 116 parallel with the direction in which the support part 114 extends are less than 40% of the lengths of the protruding parts 115 parallel with the direction in which the support part 114 extends, due to the etching residue generated in the cut away parts 116, when the metal patterns 120 are provided on the side surfaces of the support part 114 by sputtering or vapor deposition, the parts which extend in the Y'-axis direction do not become concealed, therefore the metal patterns 120 are liable to cause short-circuiting between the holding part 113 sides in the protruding parts 115 having the cut away parts 116 formed therein and the free end sides in the protruding parts 115 having the cut away parts 116 formed therein. Looking at the crystal blank 110 by a planar view, when the lengths of the cut away parts 116 parallel with the direction in which the support part 114 extends are larger than 90% of the lengths of the protruding parts 115 parallel with the direction in which the support part 114 extends, when the support part 114 receives bending vibration, the tuning fork type crystal element 100 is liable to break. For this reason, looking at the crystal blank 110 by a planar view, the lengths of the cut away parts 116 parallel with the direction in which the support part 114 extends are set to 40% to 90% of the lengths of the protruding parts 115 parallel with the direction in which the support part 114 extends. By setting the lengths in this way, the probability of short-circuiting of metal patterns 120 can be reduced between the holding part 113 sides in the protruding parts 115 having the cut away parts 116 formed therein and the free end sides in the protruding parts 115 having the cut away parts 116 formed therein, and the probability of breakage of the tuning fork type crystal element 100 can be reduced.

Further, in the tuning fork type crystal element 100 according to the first embodiment, the crystal blank 110 is provided with the weight parts 117 at the end parts of the vibrating parts 112 on the sides opposite to the base part 111. When looking at the crystal blank 110 by a planar view, the protruding parts 115 are positioned at the holding part 113 sides from the weight parts 117 and are positioned at the weight part 117 sides from base part 111. By setting the positions of the protruding parts 115 having the cut away parts 116 formed therein to the weight part 117 sides from the base part 111 in this way, the distances from the protruding parts 115 having the cut away parts 116 formed therein to the vibrating parts 112 can be made longer, therefore the influence of the protruding parts 115 having the cut away parts 116 formed therein upon the bending vibration generated in the vibrating parts 112 can be reduced. Further, by setting the positions of the protruding parts 115 having the cut away parts 116 formed therein to the holding part 113 sides from the weight parts 117, when the vibrating parts 112 and support part 114 receive bending vibration, the probability of contact of the weight parts 117 with the protruding parts 115 having the cut away parts 116 formed therein can be reduced. Accordingly, when looking at the crystal blank 110 by a planar view, by forming the protruding parts 115 so that they are positioned at the holding part 113 sides from the weight parts 117 and are positioned on the weight part 117 sides from the base part 111, it becomes possible to reduce degradation of electrical characteristics of the tuning fork type crystal element 100 according to the first embodiment.

Further, in the tuning fork type crystal element 100 according to the first embodiment, the crystal is exposed at the inner wall surfaces of the cut away parts 116, and the metal patterns 120 are not formed on the inner wall surfaces of the cut away parts 116. By doing this, the metal patterns 120 formed on the side surfaces of the protruding parts 115 having the cut away parts 116 formed therein enable reduction of generation of the bending vibration due to the inverse piezoelectric effect and piezoelectric effect in the protruding parts 115 having the cut away parts 116 formed therein. Accordingly, it becomes possible to reduce the bending vibration which is generated due to the provision of the protruding parts 115 having the cut away parts 116 formed therein, the influence upon the bending vibration generated in the vibrating parts 112 can be reduced, and it becomes possible to reduce the degradation of electrical characteristics.

Further, in the tuning fork type crystal element 100 according to the first embodiment, the protruding parts 115 are positioned between the pair of terminal parts 122. Further, from another viewpoint, when looking at the lower surface of the tuning fork type crystal element 100 according to the first embodiment by a planar view, it can be said that the protruding parts 115 having the cut away parts 116 formed therein extend outward from the side surfaces of the support part 114 between the first terminal part 122a and the second terminal part 122b. By doing this, when using the tuning fork type crystal element 100 according to the first embodiment for the crystal device 151, even if a contraction stress generated at the time of shrinkage of the conductive adhesive 134 (FIGS. 4A and 4B and FIG. 5) adhered to the first terminal part 122a and the second terminal part 122b is applied to the support part 114, the rigidity becomes stronger by the amount by provision of the protruding parts 115 having the cut away parts 116 formed therein, therefore the probability of breakage of the support part 114 due to contraction stress can be reduced.

(Method of Production of Tuning Fork Type Crystal Element 100 According to First Embodiment)

Next, a method of production of the tuning fork type crystal element 100 according to the first embodiment will be explained. The method of production of the tuning fork type crystal element 100 according to the first embodiment is comprised of a crystal wafer forming process, corrosion resistant film forming process, first resist film forming process, first exposure development process, first corrosion resistant film etching process, second resist film forming process, second exposure development process, crystal etching process, second corrosion resistant film etching process, film forming process, second resist removal process, corrosion resistant film removal process, frequency adjustment part forming process, and frequency adjustment process.

The crystal wafer forming process is the process of forming a crystal wafer from a quartz member having crystal axes of the X-axis, Y-axis, and Z-axis perpendicular to each other. In the crystal wafer forming process, a lumbered synthetic quartz crystal is cut at a predetermined cut angle and is ground until the thickness in the vertical direction becomes a predetermined thickness. In the crystal wafer after the crystal wafer forming process, the two facing surfaces become parallel with a plane which is obtained by rotating the plane parallel with the X-axis and Y-axis by −5° to 5° around the X-axis.

The corrosion resistant film forming process is the process of providing corrosion resistant films on the two major surfaces of the crystal wafer. Here, the major surfaces of the crystal wafer are made the surfaces obtained by rotating the plane parallel with the X-axis and Y-axis by −5° to 5° around the X-axis. In the corrosion resistant film forming process, metal films comprised of a material which will not be etched in the crystal etching process are formed on the two major surfaces of the crystal wafer by sputtering or vapor deposition. For the corrosion resistant film, for example use is made of chrome. Note that, here, chrome is mentioned as an example of the corrosion resistant film, but the corrosion resistant film may be given a multilayer structure comprised of, for example, a metal layer selected from any one of chrome, titanium, Nichrome, and nickel on which a metal layer selected from any of gold, silver, palladium, a metal containing gold as the principal ingredient, a metal containing silver as the principal ingredient, and a metal containing palladium as the principal ingredient is laminated.

The first resist film forming process is the process of coating the first resist on the crystal wafer having the corrosion resistant films formed thereon. The first exposure development process is the process of exposing the crystal wafer on which the first resist is coated to predetermined patterns and developing the same. When looking at the crystal wafer after the first exposure development process by a planar view, the state becomes one where the corrosion resistant films are exposed in the parts which form the groove parts 118 and along the outer circumferential edges of the crystal blank 110. The first corrosion resistant film etching process is the process of etching the corrosion resistant films which are on the crystal wafer after the first exposure development process and are exposed. Accordingly, when looking at the crystal wafer after the first corrosion resistant film etching process by a planar view, a state is exhibited where the crystal wafer is exposed in the parts which form the groove parts 118 and along the outer circumferential edges of the crystal blank 110. At this time, the first resist is also removed.

The second resist film forming process is the process of coating the second resist on the crystal wafer after the first corrosion resistant film etching process. The second exposure development process is the process of exposing the crystal wafer on which the second resist is coated to predetermined patterns and developing the same. When looking at the crystal wafer after the second exposure development process by a planar view, a state is exhibited where the corrosion resistant films are exposed in the parts which form the excitation electrode parts 121, terminal parts 122, and wiring parts 123.

The crystal etching process is the process of dipping the crystal wafer after the second exposure development process in a predetermined etching solution and etching the exposed crystal wafer. The second corrosion resistant film etching process is the process of etching and removing the exposed corrosion resistant films. When looking at the crystal wafer in the second exposure development process by a planar view, a state is exhibited where the corrosion resistant films in the parts which form the excitation electrode parts 121, terminal parts 122, and wiring parts 123 are exposed. Therefore, when looking at the crystal wafer after the second corrosion resistant film etching process by a planar view, a state is exhibited where the crystal in the parts which form the excitation electrode parts 121, terminal parts 122, and wiring parts 123 is exposed. Further, a state is exhibited where the parts which become the side surfaces of the crystal blank 110 are exposed.

The film forming process is the process of forming the metal film on the crystal wafer after the second corrosion resistant film etching process. In the film forming process, use is made of sputtering or vapor deposition. A metal film having a multilayer structure comprised of, for example, a metal layer selected from any one of chrome, titanium, Nichrome, and nickel on which a metal layer selected from any of gold, silver, palladium, a metal containing gold as the principal ingredient, a metal containing silver as the principal ingredient, and a metal containing palladium as the principal ingredient is laminated is formed on the parts in which the crystal wafer is exposed. The second resist removal process is the process of removing the second resist of the crystal wafer. The corrosion resistant film removal process is the process of removing the corrosion resistant films.

By doing this, tuning fork type crystal elements 100 according to the first embodiment are formed in a partially connected state in the crystal device. Since this type of production method is used, by extending the protruding parts 115 having the cut away parts 116 formed therein from the side surfaces of the support part 114 outward, it becomes possible to reduce the probability of short-circuiting between the first wiring parts 123a and the second wiring parts 123b.

Further, by forming the cut away parts 116 in the surfaces of the protruding parts 115 parallel with the side surface of the holding part 113 from which the support part 114 extends, it becomes possible to further reduce the probability of short-circuiting between the first wiring parts 123a and the second wiring parts 123b.

Further, when looking at the crystal blank 110 by a planar view, by setting the lengths of the cut away parts 116 in the direction parallel with the extending direction of the support part 114 to 60% to 90% of the lengths of the protruding parts 115 in the direction parallel with the extending direction of the support part 114, it becomes possible to further reduce the probability of short-circuiting between the first wiring parts 123a and the second wiring parts 123b.

Further, by exposing the crystal on the inner wall surfaces of the cut away parts 116, short-circuiting between the first wiring parts 123a and the second wiring parts 123b can be reliably prevented.

Further, by positioning the protruding parts 115 having the cut away parts 116 formed therein between the pair of terminal parts 122, even if the metal film is coated on the entire side surfaces of the support part 114, it becomes possible to reduce the probability of short-circuiting between the terminal parts 122.

The frequency adjustment part forming process is the process of forming the frequency adjustment parts 124 on the upper surfaces of the weight parts 117. In the frequency adjustment part forming process, for example, use is made of sputtering or vapor deposition. The frequency adjustment process is the process of increasing or decreasing the mass of the frequency adjustment parts 124 and thereby finely adjusting their frequencies to the predetermined frequencies. In the frequency adjustment process, for example use is made of a laser or the like.

By forming the frequency adjustment parts 124 by a process different from that for the excitation electrode parts 121, terminal parts 122, and wiring parts 123 in this way, before forming the frequency adjustment parts 124 and after measuring the frequency of the bending vibration generated in the vibrating parts 112, the film thickness in the vertical direction of the frequency adjustment part 124 can be determined. Accordingly, according to the frequency adjustment part forming process, frequencies can be adjusted roughly with respect to the desired frequency. Therefore, by the frequency adjustment process, the frequencies can be finely adjusted so as to obtain the desired frequency. For this reason, the frequencies are adjusted toward the desired frequency in two steps. Therefore, compared with the case where the frequencies are adjusted only in the frequency adjustment process, the time taken for adjustment can be shortened, so it becomes possible to improve the productivity.

(Crystal Device)

A crystal device 151 using the tuning fork type crystal element 100 according to the first embodiment will be explained by using FIG. 6 and FIG. 7. The crystal device 151 is for example a crystal unit. The crystal device 151 is mainly configured by a tuning fork type crystal element 100 according to the first embodiment, a board part 130a on which this tuning fork type crystal element 100 is mounted, a frame part 130b which is formed integrally with the board part 130a, a lid member 140 which is joined with the frame part 130b and air-tightly seals the tuning fork type crystal element 100, a conductive adhesive 134 for mounting the tuning fork type crystal element 100 on the board part 130a, and a joining member 141 for joining the frame part 130b and the lid member 140.

The board part 130a is for mounting the tuning fork type crystal element 100. The board part 130a is for example formed to the flat plate shaped rectangular shape. On one major surface of this, a pair of connection pads 131 and pillow part 133 are provided, while on the other major surface, a plurality of external terminals 132 are provided. Further, on the board part 130a, wiring patterns (not shown) for electrically connecting the pair of connection pads 131 and the external terminals 132 are provided. The board part 130a is for example comprised of an insulating layer of alumina ceramic or glass ceramic or other ceramic material. The board part 130a may be one using one insulating layer or may be one using a plurality of insulating layers laminated together.

Here, matching with the drawings, the surface of the board part 130a which faces the tuning fork type crystal element 100 is defined as the upper surface of the board part 130a, and the surface of the board part 130a which faces the side opposite to the upper surface of the board part 130a is defined as the lower surface of the board part 130a. Further, the upper surface of the board part 130a and the lower surface of the board part 130a are defined as the major surfaces of the board part 130a.

The frame part 130b is for forming a space for accommodating the tuning fork type crystal element 100 on the upper surface side of the board part 130a. Further, the frame part 130b is provided in a frame shape along the edge parts of the upper surface of the board part 130a and is integrally formed with the board part 130a. The frame part 130b is for example comprised of an insulating layer of alumina ceramic or glass ceramic or other ceramic material. The frame part 130b may be one using one insulating layer or may be one using a plurality of insulating layers laminated together.

Here, matching with the drawings, the surface of the frame part 130b which is in contact with the board part 130a side is defined as the lower surface of the frame part 130b, and the surface of the frame part 130b which faces the side opposite to the lower surface of the frame part 130b is defined as the upper surface of the frame part 130b.

The connection pads 131 are for mounting the tuning fork type crystal element 100 on the board part 130a. The connection pads 131 are provided on the upper surface of the board part 130a inside the frame part 130b. For example, when looking at the upper surface of the board part 130a by a planar view, two are arranged on a line along the long side of the board part 130a.

The external terminals 132 are for mounting on a mother board of an electronic apparatus or the like. When mounting on the mother board, they are connected and bonded to predetermined mount pads (not shown) located on the mother board by solder or the like. For example four external terminals 132 are provided—one each at the four corners of the lower surface of the board part 130a. Predetermined two external terminals 132 are electrically connected to the connection pads 131 by the wiring patterns (not shown) of the board part 130a. The size of the board part 130a, for example, when looking at the upper surface of the board part 130a by a planar view, is set so that the dimension of the long side becomes 0.65 to 5.0 mm, and the dimension of the short side becomes 0.4 to 3.2 mm.

The pillow part 133 is provided on the upper surface of the board part 130a within the frame part 130b. Looking at the upper surface of the board part 130a by a planar view, this is arranged aligned with one connection pad 131 along one short side of the board part 130a. When mounting the tuning fork type crystal element 100 on the upper surface of the board part 130a, the pillow part 133 is arranged so that the end part of the holding part 113 on the side opposite to the support part 114, that is, the end part on the −X side of the holding part 113 contacts it. By providing the pillow part 133 in this way, even if the terminal parts 122 provided on the lower surfaces of the support part 114 and holding part 113 and the connection pads 131 are joined, the probability of contact of the tuning fork type crystal element 100, specifically the vibrating parts 112, with the upper surface of the board part 130a can be reduced.

Here, a method of integrally forming the board part 130a and the frame part 130b will be explained. Where the board part 130a and frame part 130b are made of alumina ceramic, first, a plurality of ceramic green sheets obtained by adding and mixing a suitable organic solvent or the like into a predetermined ceramic material powder are prepared. Further, on the surface of the ceramic green sheets or in through holes formed in the ceramic green sheets by punching, a predetermined conductive paste is coated at the positions which will form the conductor patterns by using a conventionally known screen printing method. The ceramic green sheets which form the board part 130a and the ceramic green sheets which form the frame part 130b are laminated, press-formed, and fired at a high temperature. After firing, the predetermined parts which will form the conductor patterns are nickel plated or gold plated whereby the board part 130a and frame part 130b are integrally formed. Further, the conductive paste contains for example sintered metal powder of tungsten, molybdenum, copper, silver, or palladium or the like.

The conductive adhesive 134 is for mounting the tuning fork type crystal element 100 on the upper surface of the board part 130a. The conductive adhesive 134 is comprised of a resin binder in which a conductive filler comprised of a conductive powder is contained. As the conductive powder, for example, use is made of any one of aluminum, molybdenum, tungsten, platinum, palladium, silver, titanium, nickel, or ferronickel or combinations of the same. Further, as the binder, for example, use is made of a silicone resin, epoxy resin, polyimide resin, or bismaleimide resin. The conductive adhesive 134 is coated on the connection pads 131 and electrically bonds the connection pads 131 and the terminal parts 122 of the tuning fork type crystal element 100. The conductive adhesive 134 has for example the characteristic feature that when it is thermally cured, the resin binder contracts and thus the conductive fillers become closer to each other. Therefore, by thermal curing, electrical connection can be achieved while joining the connection pads 131 with the terminal parts 122 of the tuning fork type crystal element 100. For this reason, when the conductive adhesive 134 thermally cures, the conductive adhesive 134 contracts. Accordingly, when the conductive adhesive 134 thermally cures, stress is applied to the terminal parts 122 to which the conductive adhesive 134 is bonded in the direction toward the conductive adhesive 134.

The lid member 140 is joined with the upper surface of the frame part 130b by the joining member 141 and is for air-tightly sealing the tuning fork type crystal element 100 mounted on the upper surface of the board part 130a. The lid member 140 is for example made of an alloy containing at least one of iron, nickel, or cobalt. In such a lid member 140, by application of heat to the lid member 140 and to the joining member 141 provided between the upper surface of the frame part 130b and the lower surface of the lid member 140 in a vacuum state or in a predetermined atmosphere filled with nitrogen gas or the like, the joining member 141 is melted, and the lower surface of the lid member 140 and the upper surface of the frame part 130b are melt bonded.

The joining member 141 is provided between the lower surface of the lid member 140 and the upper surface of the frame part 130b and is for joining the lid member 140 and the frame part 130b. The joining member 141 is provided on the lower surface of the lid member 140 facing the upper surface of the frame part 130b. At this time, on the upper surface of the frame part 130b, although not particularly shown, sealing-use conductor patterns are provided, and the joining member 141 is provided in a ring shape along the outer edges of the lower surface of the lid member 140. The joining member 141 is for example provided by gold-tin or silver solder. In the case of the gold-tin, the thickness thereof is for example 10 to 40 μm. The component ratio thereof is for example 78 to 82% of gold and 18 to 22% of tin. In the case of silver solder, the thickness thereof is for example 10 to 20 μm. The component ratio thereof is for example 72 to 85% of silver and 15 to 28% of copper.

The joining member 141, for example, in the case of glass, is comprised of glass which melts at 300 to 400° C. and is for example low melting point glass containing vanadium or lead oxide-based glass. The lead oxide-based glass is comprised of lead oxide, lead fluoride, titanium dioxide, niobium oxide, boron oxide, zinc oxide, ferric oxide, copper oxide, and calcium oxide.

Next, the method of joining the lid member 140 and the frame part 130b by using the joining member 141 will be explained. The glass which forms the material of the joining member 141 is in a paste-state formed by adding a binder and solvent. This is melted, then solidified for bonding with another member. The joining member 141 is for example provided by coating a glass frit paste on the upper surface of the frame part 130b or the outer circumferential edge of the lower surface of the lid member 140 in ring shape by screen printing then making it dry.

The crystal device 151 is provided with a tuning fork type crystal element 100, a board part 130a provided with a pair of connection pads 131 to which a pair of terminal parts 122 are electrically joined, a frame part 130b which is provided integrally with the board part 130a along the edge parts of the upper surface of the board part 130a, and a lid member 140 joined to the upper surface of the frame part 130b.

In the crystal device 151, the tuning fork type crystal element 100 having the pair of terminal parts 122 provided on the lower surfaces of the support part 114 and holding part 113 is mounted. Therefore, compared with the case where the pair of terminal parts 122 are provided on the lower surface of the holding part 113, the vibrating parts 112 can be kept away from the parts joined by the conductive adhesive 134. Due to this, it becomes possible to reduce the influence upon the vibrating parts 112 by the stress received from the conductive adhesive 134 at the time of mounting the tuning fork type crystal element 100, therefore degradation of electrical characteristics due to the joining of the conductive adhesive 134 can be reduced.

Further, in the crystal device 151, a tuning fork type crystal element 100 with protruding parts 115 having the cut away parts 116 formed therein positioned between the pair of terminal parts 122 is mounted. Therefore, even if the contraction stress generated at the time of shrinkage of the conductive adhesive 134 adhered to the first terminal part 122a and second terminal part 122b is applied to the support part 114, the rigidity becomes stronger by the amount of provision of the protruding parts 115 having the cut away parts 116 formed therein, therefore the probability of breakage of the support part 114 due to contraction stress can be reduced.

Second to Sixth Embodiments

Below, crystal blanks according to the second to sixth embodiments will be explained. The crystals according to the second to sixth embodiments are different from the first embodiment only in the shapes relating to the cut away parts (including the shapes of the surroundings of the cut away parts such as the protruding parts). The shapes of the other parts may be the same as those in the first embodiment. Illustration of the weight parts 117 and groove parts 118 will be sometimes omitted. However, in the same way as the first embodiment, they may be provided. Also, the crystal elements using the crystal blanks according to the second to sixth embodiments, crystal devices, and the methods of production of the crystal elements may be similar to those in the first embodiment except for the shapes relating to the cut away parts. However, along with the differences of the shapes related to the cut away parts, the shapes of the detailed parts of the metal patterns may be different.

In the following explanation, the configurations which are the same as or similar to the configuration of the first embodiment will be assigned the notations used in the first embodiment, and the explanations will be sometimes omitted. Further, even if configurations similar to (corresponding to) the configurations in the first embodiment are assigned notations different from those in the first embodiment, the matters not specified are the same as the first embodiment.

Second Embodiment

A crystal blank 510 (FIG. 9 to FIG. 12) according to the second embodiment differs from the crystal blank 110 in the first embodiment in the points that the protruding parts 115 are not provided and the cut away parts 116 are provided in the support part 114. From another viewpoint, in the present embodiment, the auxiliary part (notation is omitted here) is configured by only the support part 114. Specifically, this is as follows.

The cut away parts 116 (116a, 116b) are provided in the side surfaces of the support part 114 parallel with the direction in which the vibrating parts 112 extend. The cut away parts 116 are configured by the first cut away part 116a which is formed in the side surface of the support part 114 at the +X side and the second cut away part 116b which is formed in the side surface of the support part 114 at the −X side. Note that, as already explained, the explanation of the shapes of the cut away parts 116 in the following description ignores the influence of the etching residue so far as not indicated otherwise.

The first cut away part 116a and second cut away part 116b are for example given shapes which are plane symmetric with respect to the Y'Z' plane containing the center line of the support part 114. The cut away parts 116 penetrate through the support part 114 in the Z'-axis direction, and their planar shapes (shapes of the planes parallel with the XY' plane) are constant in the Z'-axis direction.

Figure 12:
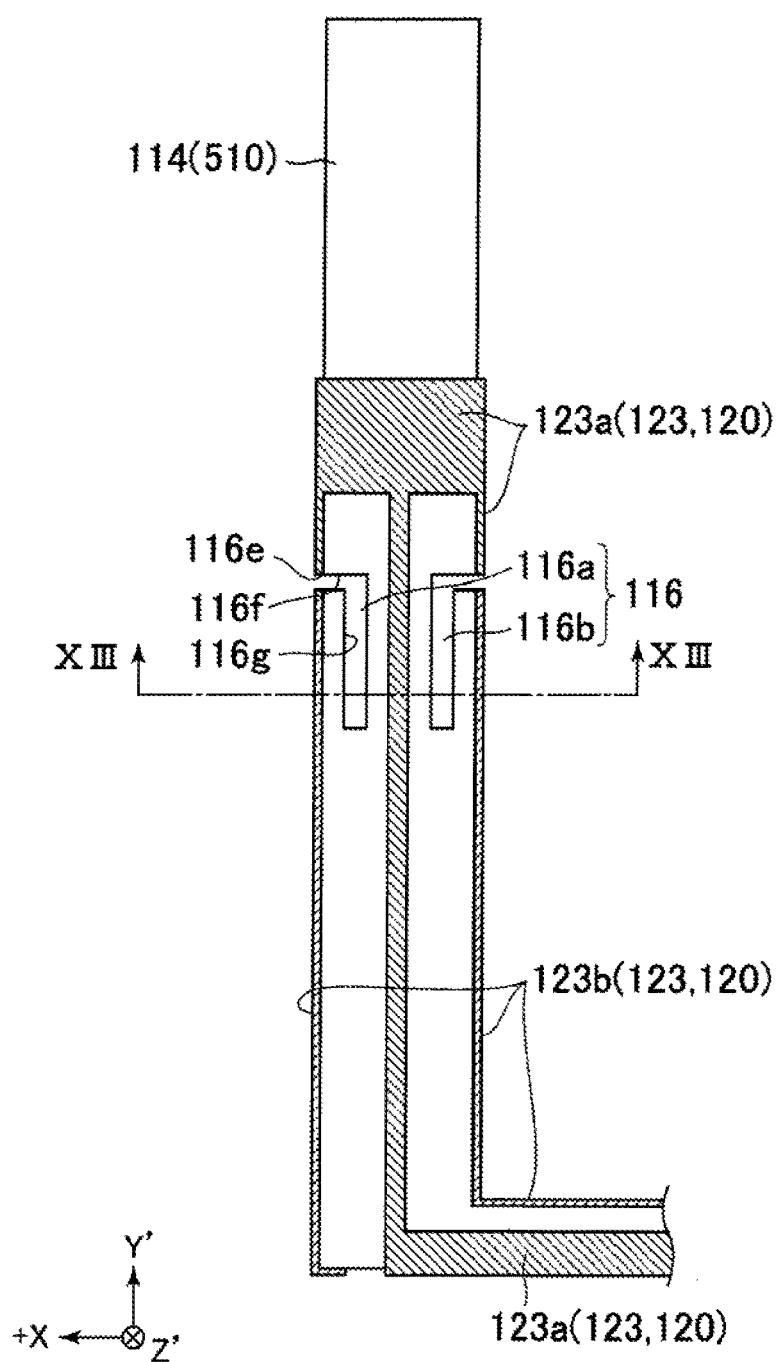
FIG. 12 is a partially enlarged view of the support part of the tuning fork type crystal element according to the second embodiment.

The cut away parts 116 are for example formed in schematically L-shaped slit shapes when viewed by a planar view. That is, the cut away parts 116, as shown in FIG. 12, have entrances 116e opened in the side surfaces of the support part 114, entrance side parts 116f which extend from the entrances 116e to the inside of the side surfaces of the support part 114 so as to cross (for example be perpendicular to) the support part 114, and deep side parts 116g which extend from the front ends of the entrance side parts 116f along (for example parallel with) the support part 114. Accordingly, when looking at the cut away parts 116 from the entrances 116e in the direction perpendicular to the side surfaces of the support part 114 (see an arrow L2 in FIG. 15B), the cut away parts 116 have concealed parts (deep side parts 116g, the parts on the side lower than an shaft of the arrow L2 on the sheet surface in FIG. 15B). Preferably, the cut away parts 116 have concealed parts (the parts on the side lower than an shaft of an arrow L1 on the sheet surface in FIG. 15B) no matter from what direction the cut away part 116 is viewed from the entrance 116e.

The entrance side parts 116f and deep side parts 116g for example linearly extend. The widths of the entrance side parts 116f and the widths of the deep side parts 116g may be constant (illustrated example) or may vary in their length directions. Further, the widths of the entrance side parts 116f and the widths of the deep side parts 116g may be the same as each other (illustrated example) or may be different from each other. The lengths of the entrance side parts 116f and deep side parts 116g may be suitably set. For example the latter may be longer than the former. For example, when measuring the lengths of the two by the lengths of the inner surfaces at the recess side of the L-shape, the lengths of the deep side parts 116g are 1.5 to 10 times the lengths of the entrance side parts 116f.

Here, the size of the crystal blank 510 when looking at the crystal blank 510 by a planar view will be explained. Except for the dimensions of the cut away parts 116 (protruding parts 115), the dimensions of the parts of the crystal blank 510 may be the same as the dimensions of the crystal blank 110 in the first embodiment. In the entrance side parts 116f of the cut away parts 116, the lengths in the directions parallel with the Y'-axis become 5 to 20 μm, and the lengths in the directions parallel with the X-axis (the lengths from the entrances 116e to the corner parts at the inner surfaces of the outside of the L-shape) become 15 to 35 μm. In the deep side parts 116g of the cut away parts 116, the lengths in the directions parallel with the X-axis become 5 to 20 μm, and the lengths in the directions parallel with the Y'-axis (note, the lengths from the corner parts to the back at the inner surfaces of the outside of the L-shape) become 25 to 285 μm.

Note that, the cut away parts 116 are relatively narrow in width and/or are etched utilizing an undercut as will be explained later. Therefore, there is relatively large residue. For example, in the cut away parts 116, the back sides thereof and about a half of the entire design lengths sometimes form recessed groove shapes due to the residue. The example of the dimensions explained above gives design values.

(Configuration of Metal Patterns)

The configuration of the metal patterns 120 is basically as explained in the first embodiment. However, in the present embodiment, the protruding parts 115 is not provided, therefore the details of the range of arrangement of the wiring parts 123 around the cut away parts 116 are different from the first embodiment.

Figure 10A:
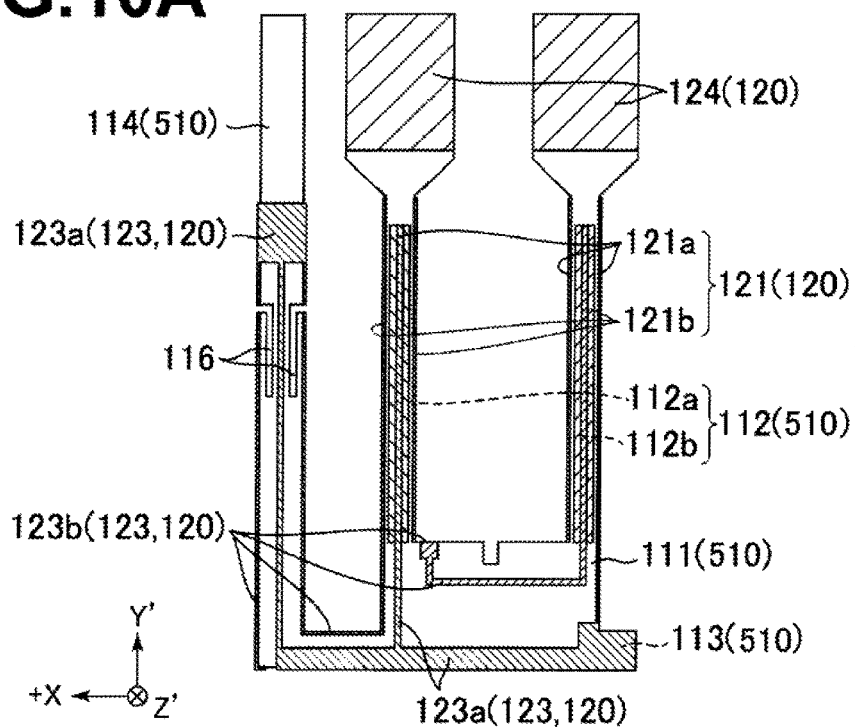
FIG. 10A is a plan view of the upper surface of the tuning fork type crystal element according to the second embodiment.
Figure 10B:
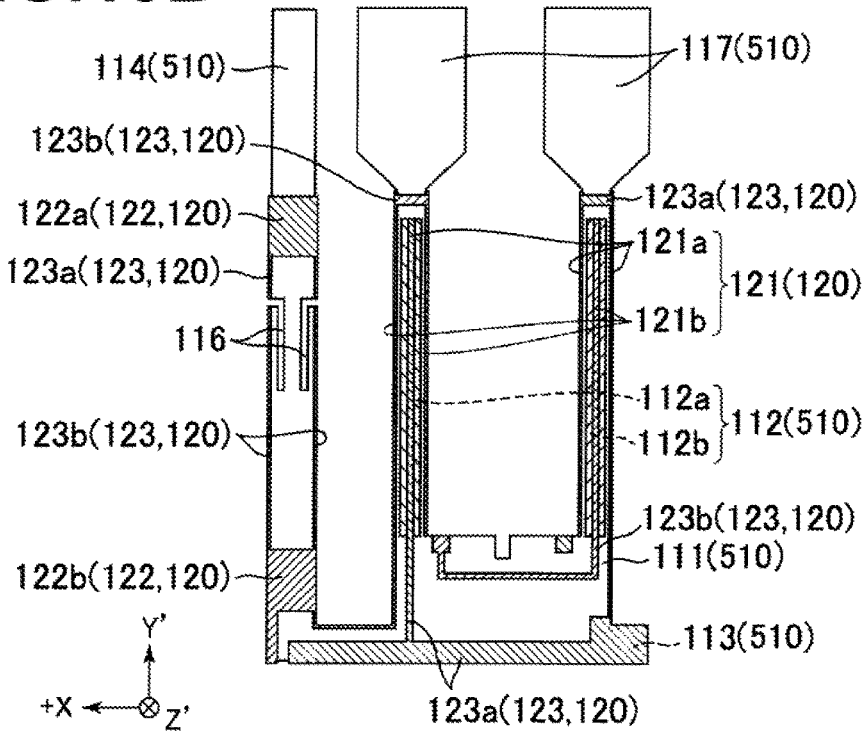
FIG. 10B is a plan view of the lower surface of the tuning fork type crystal element according to the second embodiment seen through the upper surface.

Specifically, as shown in FIGS. 10A and 10B, on the side surfaces of the support part 114, parts of the first wiring parts 123a are provided from the edge parts of the cut away parts 116 on the first terminal part 122a side up to the first terminal part 122a. Further, parts of the second wiring parts 123b are provided from the edge parts of the cut away parts 116 on the holding part 113 side up to the end part of the support part 114 on the holding part 113 side on the side surfaces of the support part 114.

The first wiring parts 123a and second wiring parts 123b are not formed on the inner wall surfaces of the cut away parts 116. Accordingly, the first wiring parts 123a and the second wiring parts 123b are separated by the cut away parts 116 on the side surfaces of the support part 114.

(Method of Production of Tuning Fork Type Crystal Element 500 According to Second Embodiment)

The method of production of a crystal element 500 is the same as the method of production of the crystal element 100 in the first embodiment. Here, part will be explained while suitably referring to FIG. 13A to FIG. 15B. FIG. 13A to FIG. 15A are cross-sectional views corresponding to line XIII-XIII in FIG. 12. The manufacturing process proceeds in order from FIG. 13A to FIG. 15A. Note that, in these diagrams, sometimes use is made of the same notations even if the shapes etc. of the members change along the progress in the manufacturing process.

Figure 13A:
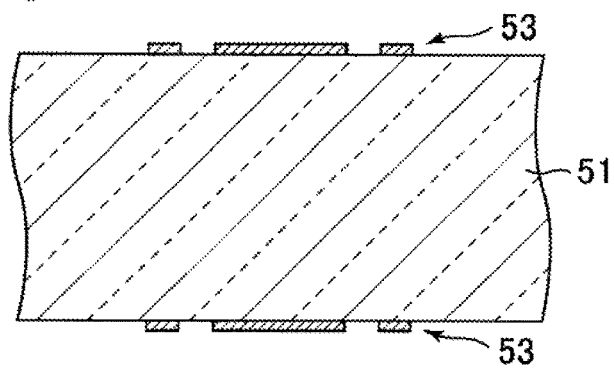
FIGS. 13A to 13C are cross-sectional views showing an example of a method of production of a tuning fork type crystal element according to the second embodiment.

FIG. 13A shows a state where the first resist is removed after the first corrosion resistant film etching process. The outer circumferential edge of the crystal blank 510 for example includes the edge parts of the cut away parts 116 as well. Accordingly, the corrosion resistant film 53 is etched in the region which becomes the cut away parts 116, and the crystal wafer 51 is exposed in this region.

Figure 13B:
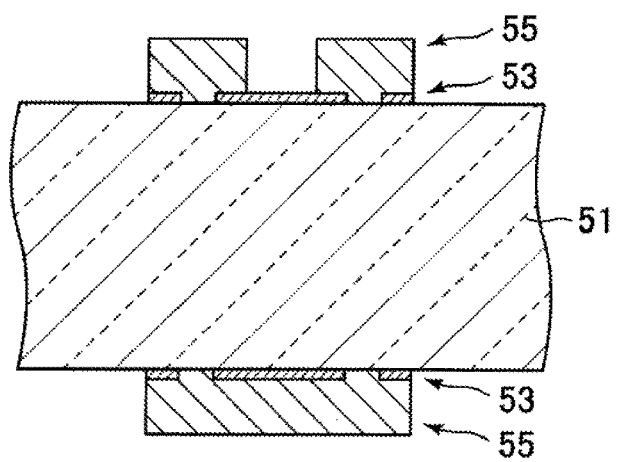

FIG. 13B shows the crystal wafer 51 after the second exposure development process. The second resist 55 is etched in the region in which the first wiring parts 123a are provided, and the corrosion resistant film 53 is exposed in this region. On the other hand, the second resist 55 is not etched in the region in which the cut away parts 116 are formed and covers the crystal wafer 51 in this region.

After that, by the crystal etching process, the crystal wafer is etched at the parts which are exposed from the corrosion resistant film and second resist, whereby the external forms (side surfaces etc.) of a plurality of crystal blanks 510 are formed from the crystal wafer. However, at this stage, the plurality of crystal blanks 510 may be maintained in the wafer state by connection by a disposable holding frame. The side surfaces of the crystal blanks 510 formed by etching are exposed without being covered by the corrosion resistant film and second resist unlike the major surfaces of the crystal blanks 510.

Figure 13C:
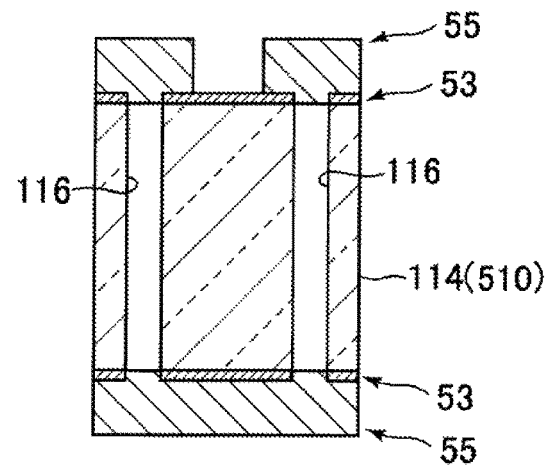

FIG. 13C shows the crystal wafer (crystal blank 510) after the crystal etching process. The support part 114 is in a state where its side surfaces are exposed. In the region in which the cut away parts 116 are provided, the second resist 55 is positioned, but the corrosion resistant film 53 is not positioned. In this region, the adhesion of the second resist 55 with respect to the crystal wafer 51 is lower compared with the adhesion of the multilayer structure formed by the corrosion resistant film 53 and second resist 55 with respect to the crystal wafer 51. Further, the etching solution in the crystal etching has the characteristic passing through the second resist 55. Therefore, in the crystal wafer 51, the etching proceeds from the positions which become the entrances 116e of the cut away parts 116 to the positions which become the deep sides of the cut away parts 116. In this way, the cut away parts 116 are formed at the same time as the formation of the fundamental shape of the crystal blank 510 such as the side surfaces of the support part 114.

Figure 14A:
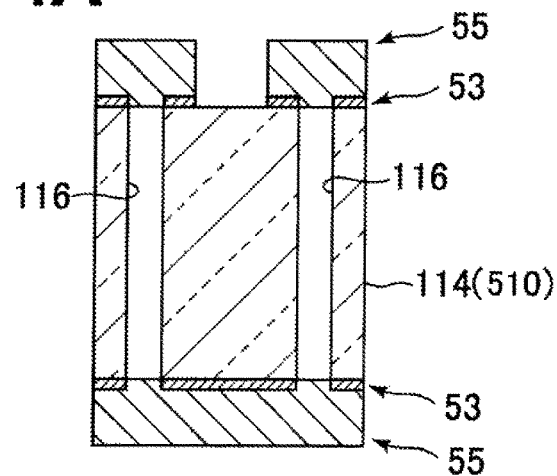
FIGS. 14A to 14C are cross-sectional views showing a continuation from FIG. 13C.

FIG. 14A shows the crystal wafer (crystal blank 510) after the second corrosion resistant film etching process. The corrosion resistant film 53 is etched in the region where the first wiring parts 123a are provided. Note that, the cut away parts 116 are still covered by the second resist 55.

Figure 14B:
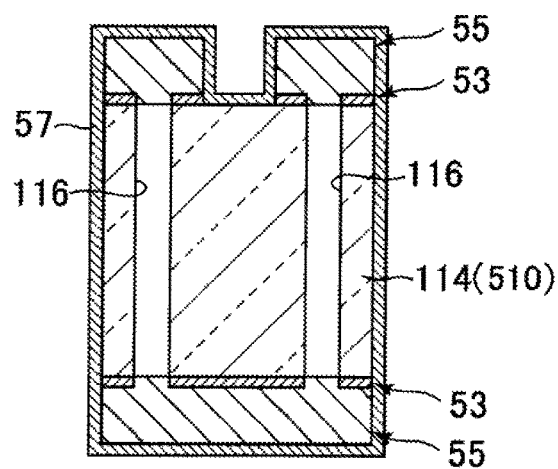

FIG. 14B shows the crystal wafer (crystal blank 510) after the film forming process. The metal film 57 is basically formed over the entire surface of the crystal blank 510 directly or indirectly through the second resist 55. In the diagram, the metal film 57 is directly formed in the regions in which the metal patterns 120 are formed, that is, on the side surfaces and part of the upper surface in the support part 114. In other regions, the film is formed on the second resist 55. The cut away parts 116 are covered by the second resist 55, therefore the metal film 57 is not formed on their inner wall surfaces.

Figure 14C:
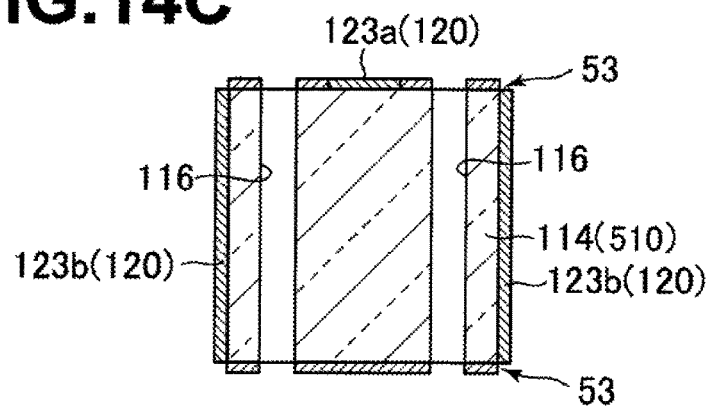

After that, as already explained, the second resist removal process is carried out. For example, the second resist is dissolved by the solvent from parts (not shown) in which the metal film 57 is made discontinuous by overhang in the second resist, FIG. 14C shows the crystal wafer (crystal blank 510) after the second resist removal process. By removing the second resist 55, the parts located on the second resist 55 in the metal film 57 are also removed. Due to this, the metal film 57 is patterned, and metal patterns 120 including the wiring parts 123 etc. are formed. That is, in the illustrated example, the lift-off method is used to form the metal patterns 120. Note that, the second resist 55 is also removed at the cut away parts 116.

Figure 15A:
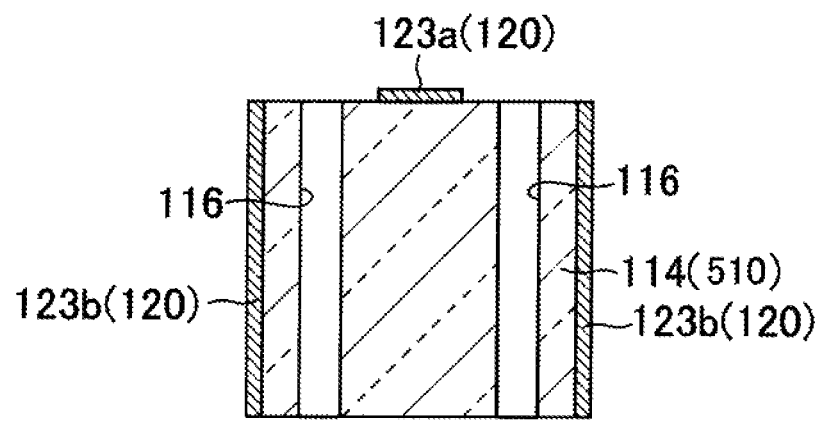

After that, as already explained, the corrosion resistant film removal process is carried out. For example, the etching is carried out by an etching solution having a relatively low etching rate with respect to the materials of the metal patterns 120 (at least the metal layer configuring the surface thereof) and having a relatively high etching rate with respect to the material of the corrosion resistant film. As a result, as shown in FIG. 15A, the crystal element 500 is prepared.

Figure 15B:
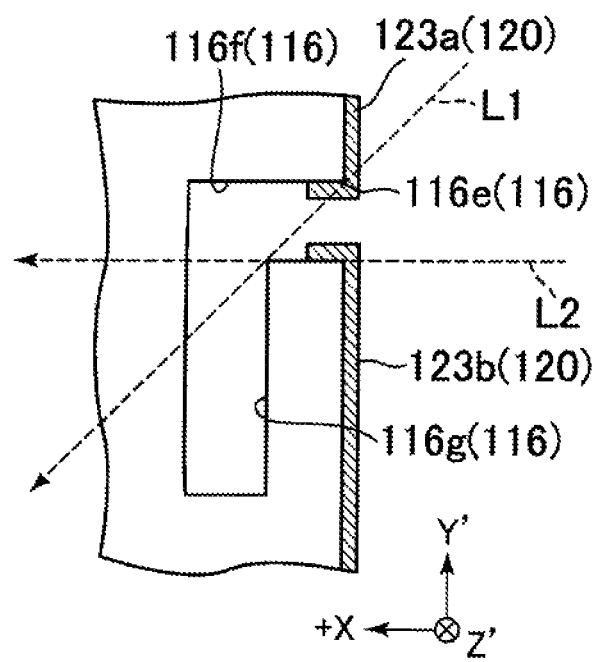
FIG. 15B is a plan view of a cut away part of the tuning fork type crystal element.

FIG. 15B is a plan view of a cut away part 116. In the film forming process (FIG. 14B), as already explained, the cut away part 116 is covered in its upper and lower surfaces by the second resist 55, therefore the metal film 57 is basically not formed. However, the entrance 116e is opened in the side surface of the support part 114, therefore the material which becomes the metal film 57 enters into the cut away part 116 from the entrance 116e. At this time, for example, a sufficient depth from the entrance 116e is secured in the cut away part 116, therefore the material which becomes the metal film 57 forms a film in only part of the cut away part 116 at the entrance 116e side. Accordingly, the first wiring parts 123a and the second wiring parts 123b do not short-circuit. The two are separated.

Note that, before the formation of the second resist 55, the crystal etching process may be carried out through the corrosion resistant film 53 or a multilayer structure configured by the corrosion resistant film 53 and first resist so as to form the fundamental shape of the crystal blank 510 and the cut away parts 116. That is, the cut away parts 116 may be formed by normal etching not undercut.

Further, in such case, after the crystal etching, the corrosion resistant film 53 may be removed and the metal patterns 120 may be formed by the second resist film forming process, second exposure development process, film forming process, and second resist removal process. The patterns of the second resist 55 in this case may be the same as the previously explained patterns of the second resist 55 provided on the corrosion resistant film 53 or may be different.

In the case where the patterns are the same as the previously explained patterns, the cut away parts 116, in the same way as the previously explained method, contribute to the separation of the first wiring parts 123a and the second wiring parts 123b. When the patterns are different from the previously explained patterns, for example, in the ranges including the entrances 116e of the cut away parts 116 in the Y'-axis direction, the second resist 55 is bridged between the support part 114 and the first vibrating part 112a. Due to this, the first wiring parts 123a and the second wiring parts 123b may be patterned and separated on the side surfaces of the support part 114 as well. That is, the cut away parts 116 need not directly contribute to the separation of the first wiring parts 123a and the second wiring parts 123b, but may contribute to reduction of fear of short-circuiting.

As described above, in the present embodiment, the crystal blank 510 has the base part 111, the pair of vibrating parts 112 which extend from the base part 111 parallel with each other, the support part 114 (auxiliary part) which is positioned on one side (+X side) of the alignment direction (X-axis direction) of the pair of vibrating parts 112 with respect to the base part 111 and pair of vibrating parts 112 and extends parallel with respect to the pair of vibrating parts 112, and the holding part 113 which is positioned on the side opposite to the pair of vibrating parts 112 relative to the base part 111 and connects the base part 111 and the support part 114. When viewed in the direction (Z'-axis direction) perpendicular to the X-axis direction and to the direction in which the support part 114 extends (Y'-axis direction), the cut away parts 116 are formed in the side surfaces of the auxiliary part (support part 114).

Accordingly, for example, in a case where the natural frequency in the first order or higher vibration mode of the support part 114 which is not provided with the cut away parts 116 and the natural frequency of the second order or higher vibration mode of the vibrating parts 112 approach and the spurious vibration ends up becoming large, the natural frequency is shifted by changing the bending rigidity of the support part 114 by providing the cut away parts 116 so that the spurious vibration can be reduced. Further, for example, as explained with reference to FIG. 15B, in the case where the first wiring parts 123a and the second wiring parts 123b are provided on the same side surfaces of the support part 114, the cut away parts 116 contribute also to reduction of fear of short-circuiting of them.

Further, in the present embodiment, when looking at the cut away parts 116 from their entrances 116e in the directions which are perpendicular to the regions around the entrances 116e in the side surfaces of the support part 114 (see arrow L2 in FIG. 15B), the cut away parts 116 have concealed parts (parts deeper than the shaft of the arrow L2 in FIG. 15B, deep side parts 116g).

Accordingly, for example, in the film forming process explained with reference to FIG. 14B, even if the material which becomes the metal film 57 enters through the entrances 116e, the metal film 57 is hard to form in the concealed parts. In particular, in the cut away parts 116, the metal film 57 is difficult to form on the inner surface which crosses (for example is perpendicular to) the direction parallel with the arrow L2 so as to face the direction indicated by the arrow L2 (the inner surface of the deep side parts 116g on the right side on the sheet surface in FIG. 15B). Accordingly, the effect of reducing fear of short-circuiting of the first wiring parts 123a and the second wiring parts 123b is improved.

Further, in the present embodiment, the cut away parts 116 have parts which are concealed when viewed from their entrances 116e in any direction (parts deeper than the shaft of the arrow L1 in FIG. 15B). In this case, the effect of reducing fear of short-circuiting of the first wiring parts 123a and the second wiring parts 123b is further improved.

Further, in the present embodiment, at the side surfaces of the support part 114, the regions around the entrances 116e are parallel with the direction in which the support part 114 extends. The cut away parts 116 have entrance side parts 116f which extend from the entrances 116e so as to cross (for example be perpendicular to) the direction in which the support part 114 extends and the deep side parts 116g which extend from the sides opposite to the entrances 116e in the entrance side parts 116f so as to follow (for example be parallel with) the direction in which the support part 114 extends.

Accordingly, for example, it is easy to suppress reduction of the width (X-axis direction) of the part of the support part 114 which connects the front end side and the root side from the cut away parts 116 (in the present embodiment, the part between the pair of cut away parts 116) while securing the lengths of the cut away parts 116 (from the entrances 116e up to the deepest parts). As a result, for example, the strength of the support part 114 is secured while the first wiring parts 123a and the second wiring parts 123b are reliably separated.

In the support part 114, the side surface having the cut away part 116 (first cut away part 116a) opened therein is a surface which linearly extends from the root of the support part 114 up to the front end parallel with the pair of vibrating parts 112 and faces the opposite side to the pair of vibrating parts 112 in the alignment direction of the pair of vibrating parts 112.

That is, as will be understood from a comparison with the fourth embodiment (FIG. 16B) which will be explained later, the support part 114 does not have a part that protrudes to the opposite side (+X side) to the pair of vibrating parts 112. Accordingly, for example, the crystal blank 510 is reduced in size in the X-axis direction. As a result, for example, the crystal device 151 can be reduced in size. Further, for example, when multiple crystal blanks 510 are produced from a crystal wafer 51, the productivity can be improved by making the distance between the crystal blanks 510 short and making the number of the crystal blank 510 prepared from the crystal wafer 51 large.

Further, the tuning fork type crystal element 500 according to the present embodiment has the tuning fork type crystal blank 510 as described above and the metal patterns 120 provided on the surface of the crystal blank 510. The metal patterns 120 include the first excitation electrode parts 121a positioned at the pair of vibrating parts 112, second excitation electrode parts 121b positioned at the pair of vibrating parts 112, first terminal part 122a which is positioned at the front end side part from the base part 111 in the support part 114, second terminal part 122b which is positioned at least at one of the root side part from the first terminal part 122a in the support part 114 or the support part 114 side part in the X-axis direction in the holding part 113, the first wiring parts 123a connecting the first excitation electrode parts 121a and the first terminal part 122a, and the second wiring parts 123b connecting the second excitation electrode parts 121b and the second terminal part 122b.

Accordingly, mounting the crystal element 500 using the support part 114 is possible. Further, by the provision of the cut away parts 116 in the support part 114 thereof, as explained above, the effect of facilitation of shift of the natural frequency of the support part 114 and the effect of facilitation of separation of the first wiring parts 123a and the second wiring parts 123b are obtained.

Further, in the present embodiment, the first wiring parts 123a have parts which are positioned at the front end side of the support part 114 from the entrances 116e of the cut away parts 116 at the side surfaces of the support part 114. The second wiring parts 123b have parts which are positioned at the root side of the support part 114 from the entrances 116e of the cut away parts 116 at the side surfaces of the support part 114.

That is, on one side surface of the support part 114, the first wiring parts 123a and the second wiring parts 123b are positioned sandwiching the cut away part 116 therebetween. Accordingly, the effect is exhibited of facilitation of the separation of the first wiring parts 123a and the second wiring parts 123b by the cut away part 116.

Further, the crystal device 151 according to the present embodiment has the tuning fork type crystal element 500 as described above, the board part 130a which is provided with the pair of connection pads electrically adhered to the first terminal parts 122a and the second terminal parts 122b, the frame part 130b which is provided integrally with the board part 130a along the edge parts of the upper surface of the board part 130a, and the lid member 140 joined with the upper surface of the frame part 130b.

Accordingly, it is possible to mount the crystal element 500 in a high degree of parallelism with respect to the board part 130a and lid member 140 by using the support part 114. Further, by the provision of the cut away parts 116 in the support part 114, as explained above, the effect of facilitation of shift of the natural frequency of the support part 114 and the effect of facilitation of separation of the first wiring parts 123a and the second wiring parts 123b are exhibited.

Further, the method of production of the tuning fork type crystal element 500 according to the present embodiment has the crystal blank forming step of forming the tuning fork type crystal blank 510 by etching (FIG. 13A to FIG. 14A) and a metal pattern forming step of forming the metal patterns 120 on the tuning fork type crystal blank 510 by the lift-off method (FIG. 14B to FIG. 15A). The crystal blank 510 formed in the crystal blank forming step has the shape of the crystal blank 510 of the present embodiment explained above. In the metal pattern forming step, the metal film 57 which forms the metal patterns 120 is formed in a state where the cut away parts 116 are covered from the upper and lower directions by the lifted off second resist 55 (FIG. 14B).

Accordingly, in the cut away parts 116, basically the metal film 57 is not formed. As a result, the cut away parts 116 contribute to the separation of the metal patterns 120 (the first wiring parts 123a and second wiring parts 123b).

Third Embodiment

Figure 16A:
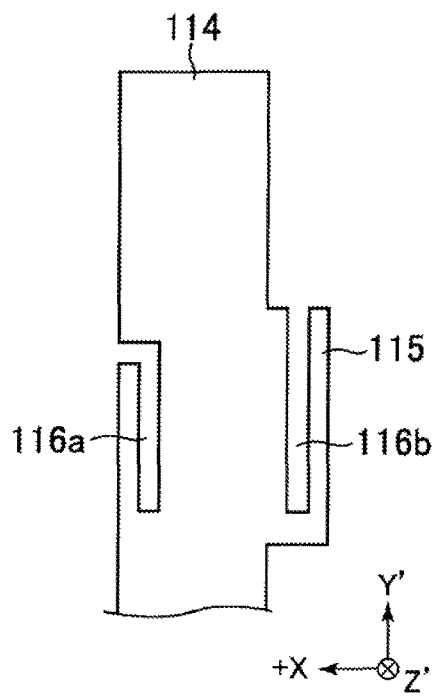
FIGS. 16A to 16C are partially enlarged views of support parts of tuning fork type crystal blanks according to a third to fifth embodiments.

FIG. 16A is a plan view showing a part of the support part 114 of a crystal blank according to a third embodiment.

The third embodiment is a combination of the first embodiment and second embodiment. Specifically, between the side surfaces of the support part 114, the protruding part 115 is provided on the side surface on the vibrating part 112 side (−X side), in the same way as the first embodiment, and the second cut away part 116b is provided in the protruding part 115. Between the side surfaces of the support part 114, in the same way as the second embodiment, the first cut away part 116a is directly provided on the side surface on the side opposite to the pair of vibrating parts 112.

The position and length of the protruding part 115 in the direction in which the support part 114 extends (Y'-axis direction) are for example set so that at least a part overlaps at least a part of the first cut away part 116a. In the illustrated example, the protruding part 115 overlaps all of the first cut away part 116a in the Y'-axis direction and further extends toward the two sides of the Y'-axis direction from the range of arrangement of the first cut away part 116a.

The second cut away part 116b, for example, when viewed by a planar view, is formed so as to cut into the side surface of the protruding part 115 facing one side (front end side in the shown example) of the direction in which the support part 114 extends (Y'-axis direction). The shape of the second cut away part 116b is for example a slit shape linearly extending with a constant width. The second cut away part 116b, for example, is provided so that its inner surface on the support part 114 side (+X side) is apart from the side surface of the support part 114 on the protruding part 115 side (−X side) of the support part 114 toward the side of protrusion of the protruding part 115 (−X side). However, the inner surface of the second cut away part 116b on the support part 114 side may also be flush with the side surface of the support part 114 on the protruding part 115 side. The length of the second cut away part 116b is for example made substantially equal to the length of the first cut away part 116a.

The dimensions of the protruding part 115 and second cut away part 116b may be the same as those in the first embodiment, and the dimension of the first cut away part 116a may be the same as that in the second embodiment.

As described above, in the present embodiment, in the same way as the first and second embodiments, the crystal blank has the base part 111, pair of vibrating parts 112, support part 114 (auxiliary part), and holding part 113. The first cut away part 116a is formed in the side surface (+X side) of the auxiliary part (support part 114) when viewed by a planar view. Therefore, the same effects as those by the first and second embodiments are exhibited. For example, adjustment of the frequency and separation of the wiring parts 123 are facilitated.

Further, in the present embodiment, the crystal has a protruding part 115. The protruding part 115 protrudes from the side surface of the support part 114 on the opposite side (−X side) to the side surface cut into by the first cut away part 116a. In the direction in which the support part 114 extends (Y'-axis direction), at least a part of the range of arrangement of the protruding part 115 overlaps at least a part of the range of arrangement of the first cut away part 116a.

Accordingly, for example, when the first cut away part 116a is directly provided in the support part 114, the part of the support part 114 connecting the front end side and the root side from the first cut away part 116a becomes narrower and the strength of the support part 114 falls, but the fall in the strength is compensated for by the protruding part 115. Further, for example, in the case of combination with the configuration explained in the second embodiment in which the side surface cut into by the first cut away part 116a (the side surface on the side opposite to the side surface provided with the protruding part 115) is a surface that linearly extends from the root to the front end of the support part 114 parallel with the pair of vibrating parts 112 and faces the opposite side to the pair of vibrating parts 112 in the alignment direction of the pair of vibrating parts 112 (X-axis direction), as understood from the comparison with the fourth embodiment (FIG. 16B) which will be explained later, the size of the crystal can be reduced while improving the strength of the support part 114.

Further, in the present embodiment, a cut away part 116 (second cut away part 116b in the present embodiment) is formed in the protruding part 115 when viewed by a planar view.

Accordingly, for example, in the same way as the second embodiment, it is possible to form the first cut away part 116a and second cut away part 116b on the two sides of the support part 114 in the width direction and improve the strength of the support part 114 can be improved by the protruding part 115. Even if the inner surface of the second cut away part 116b on the support part 114 side (+X side) becomes flush with the side surface of the support part 114 on the protruding part 115 side (−X side), compared with the case where this side surface on the −X side is cut into by the second cut away part 116b (second embodiment), the strength of the support part 114 is improved. In this case, the amount of projection of the protruding part 115 can be made smaller, therefore the fear of the protruding part 115 abutting against the vibrating part 112 is reduced. On the other hand, if the inner surface of the second cut away part 116b on the +X side is separated from the side surface of the support part 114 on the −X side, the effect of reinforcement of strength of the support part 114 becomes higher.

Fourth Embodiment

Figure 16B:
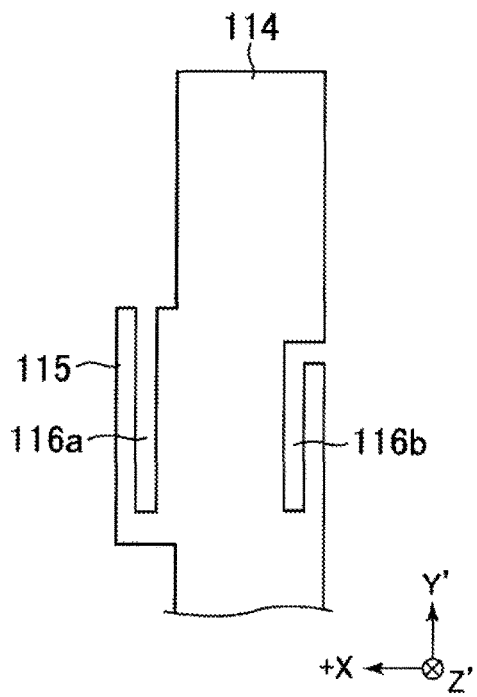

FIG. 16B is a plan view showing a part of the support part 114 in the crystal blank according to a fourth embodiment. The present embodiment is the same as the third embodiment except that the side surface provided with the protruding part 115 is reverse to the third embodiment concerning the two side surfaces of the support part 114.

That is, in the present embodiment, between the two side surfaces of the support part 114, the side surface on the opposite side (+X side) to the pair of vibrating parts 112 is provided with the protruding part 115 and the side surface on the side (−X side) of the pair of vibrating parts 112 is cut into by the second cut away part 116b. In the protruding part 115, the first cut away part 116a is provided. Also, the shapes and sizes of the protruding part 115 and the cut away part 116 (first cut away part 116a) provided in the protruding part 115 are the same as those in the third embodiment except that the direction in the X-axis direction is reverse.

In the present embodiment as well, in the same way as the first to third embodiments, the crystal has the base part 111, pair of vibrating parts 112, support part 114 (auxiliary part), and holding part 113, and the second cut away part 116b is formed in the side surface (−X side) of the auxiliary part (support part 114) when viewed by a planar view, therefore the same effects as those by the first to third embodiments are exhibited. For example, the adjustment of frequency and separation of the wiring parts 123 are facilitated.

Further, also in the present embodiment, in the same way as the third embodiment, the crystal has the protruding part 115. The protruding part 115 protrudes from the side surface of the support part 114 on the opposite side (+X side) to the side surface which is cut into by the second cut away part 116b. In the direction in which the support part 114 extends (Y'-axis direction), at least a part of the range of arrangement of the protruding part 115 overlaps at least a part of the range of arrangement of the second cut away part 116b. Accordingly, the effect the same as that by the third embodiment is exhibited. For example, in the support part 114, the strength which is lowered due to the provision of the second cut away part 116b can be compensated for.

In the present embodiment, conversely to the third embodiment, the protruding part 115 is provided on the side surface of the support part 114 on the side opposite to the pair of vibrating parts 112. In this case, for example, there is no fear of the protruding part 115 abutting against the vibrating parts 112, therefore the degree of freedom of design concerning the arrangement position and size of the protruding part 115 is high.

Fifth Embodiment

Figure 16C:
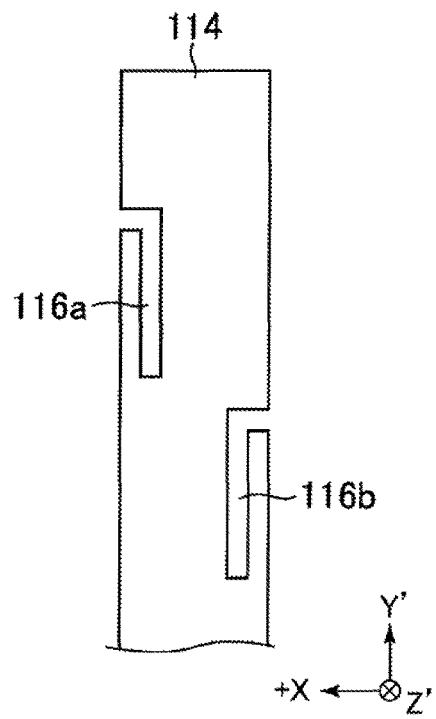

FIG. 16C is a plan view showing a part of the support part 114 in a crystal blank according to a fifth embodiment. The fifth embodiment is different from the second embodiment only in the point that the first cut away part 116a and the second cut away part 116b do not become plane symmetric.

For example, the first cut away part 116a and the second cut away part 116b are offset in position from each other in the direction in which the support part 114 extends (Y'-axis direction). Specifically, for example, the entire ranges of arrangement of the two do not overlap in the Y'-axis direction. Note that, no overlapping referred to here means separation of the ranges of arrangement of the two from each other in the Y'-axis direction and excludes a case where the end part on the +Y' side of one (the second cut away part 116b in the shown example) and the end part on the −Y' side of the other (the first cut away part 116a in the shown example) match. The shapes and sizes of the first cut away part 116a and the second cut away part 116b may be different from each other or may be the same as each other (illustrated example).

By that the first cut away part 116a and the second cut away part 116b not overlapping in the Y'-axis direction in this way, in the support part 114, there is no longer any part sandwiched between the two in the X-axis direction, and the width (X-axis direction) is made narrower by only one cut away part 116. As a result, for example, compared with the second embodiment, the strength of the support part 114 is improved. Note that, even in a case where a part of the first cut away part 116a and a part of the second cut away part 116b are made to overlap each other, compared with a case where a part or all of one overlaps the entire other, the length (Y'-axis direction) of the part making the width narrower becomes short, therefore the strength of the support part 114 is improved.

Sixth Embodiment

Figure 17:
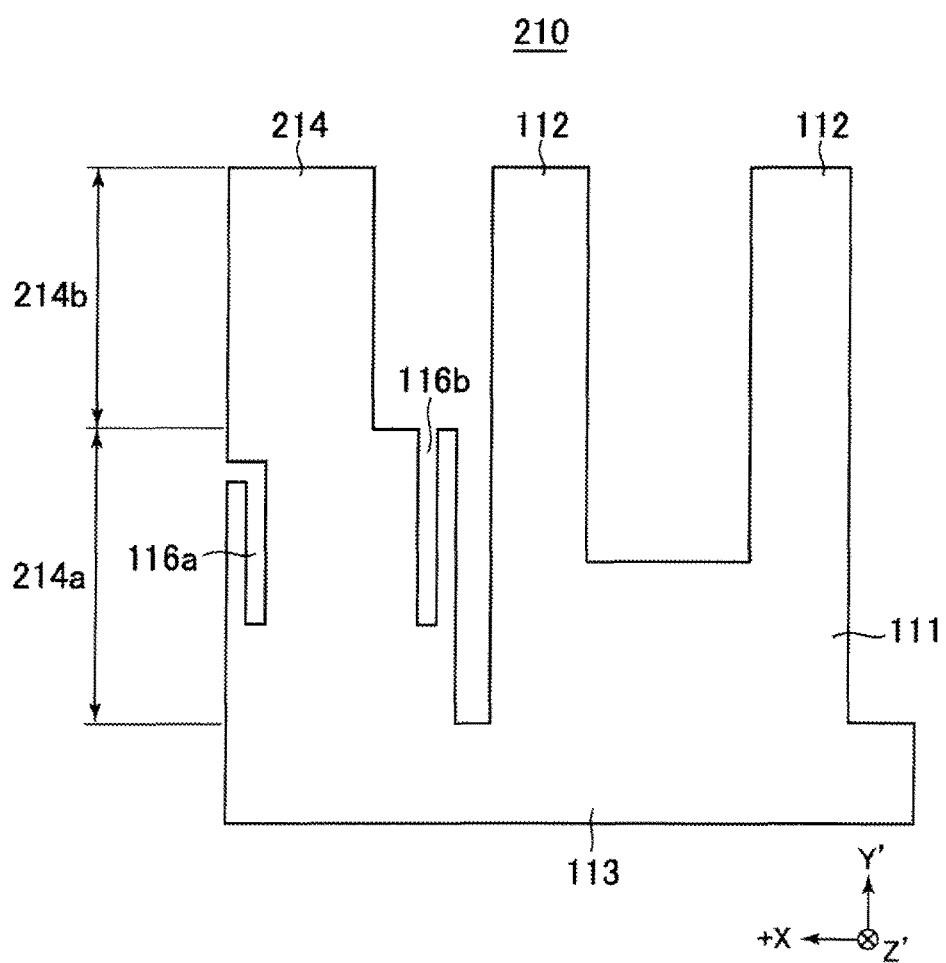
FIG. 17 is a plan view of a tuning fork type crystal blank according to a sixth embodiment.

FIG. 17 is a plan view showing a crystal blank 210 according to a sixth embodiment. The sixth embodiment is basically different from the second embodiment in the point that a support part 214, on its root side, has a broad part 214a having a broad width (X-axis direction) compared with the front end side part 214b, and this broad part 214a is provided with the cut away part 116 (second cut away part 116b). The rest is substantially the same as in the second embodiment.

Specifically, in the broad part 214a, compared with the front end side part 214b, the width becomes wider by expansion toward the vibrating part 112 side (−X side). Accordingly, the side surface of the support part 214 on the opposite side (+X side) to the vibrating part 112 side linearly extends from the root to the front end of the support part 214 in the same way as the second embodiment.

Note that, the protruding parts 115 in the third and fourth embodiments protrude in the alignment direction of the pair of vibrating parts 112 (X-axis direction) compared with both of the front end side and the root side of the support part 114. In the present application, the protruding part 115 is regarded as a part different from the support part 114, and the cut away part 116 provided in the side surface of the protruding part 115 is not included in the cut away part 116 provided in the side surface of the support part 114. On the other hand, the broad part 214a protrudes in the X-axis direction relative to the front end side part 214b of the support part 214. However, on the root side from the broad part 214a, there is no side surface of the support part 214 to be compared with the broad part 214a. In the present application, the broad part 214a is regarded as a part of the support part 214, and the cut away parts 116 provided in the side surfaces of the broad part 214a (surfaces facing the +Y side and −X side or +X side) are regarded as types of cut away parts 116 provided in the side surfaces of the support part 214.

In the broad part 214a, the shape of the part which is added to the virtual shape of the support part 214 when assuming that the front end side part 214b is extended to the root side of the support part 214 is for example a substantially rectangular parallelepiped. The width (X-axis direction) and length (Y'-axis direction. From another viewpoint, the position of the front end of the broad part 214a) of this additional part may be suitably set so far as the vibrating parts 112 do not abut against the broad part 214a when the vibrating parts 112 vibrates. For example, the position of the front end of the broad part 214a may be the root side of the support part 214 or the front end side of the support part 214 from the side surface of the base part 111 on the vibrating part 112 side (+Y' side). From the viewpoint of being able to make the formation of the second cut away part 116b longer in the Y'-axis direction, the position of the front end of the broad part 214a may be made the front end side of the support part 214 from the base part 111 or the length of the broad part 214a may be made half or more of the length of the support part 214.

The second cut away part 116b is for example formed so as to cut into the surface facing the front end side of the support part 214 among the side surfaces of the broad part 214a. The shape of the second cut away part 116b, for example, is slit shaped so as to linearly extend with a constant width in the direction in which the support part 114 extends (Y'-axis direction). The second cut away part 116b is for example provided so that, for example, its inner surface on the opposite side (+X side) to the pair of vibrating parts 112 is separated from the side surface of the front end side part 214b on the side of the pair of vibrating parts 112 (−X side) toward the side (−X side) of expansion of the broad part 214a. However, the inner surface on the +X side of the second cut away part 116b may also be flush with the side surface of the front end side part 214b on the −X side. The length of the second cut away part 116b is for example made substantially equal to the length of the first cut away part 116a.

Here, an example of the dimensions will be illustrated. For example, in the case of the dimensions illustrated in the explanation of the first embodiment (for example, the width (X-axis direction) of the support part 214 (front end side part 214b here) is 50 to 120 μm and the length (Y'-axis direction) of the support part 214 is 745 to 1010 μm), the amount of projection (X-axis direction) of the broad part 214a relative to the front end side part 214b is 20 to 60 μm, and the length of the broad part 214a in the Y'-axis direction is 300 to 800 μm. The length of the front end side part 214b is 445 to 710 μm. In this case, the width (X-axis direction) and length (Y'-axis direction) of the second cut away part 116b may be the same as the dimensions illustrated in the explanation of the first embodiment.

In the support part 214, the position, shape, and size of the first cut away part 116a which is provided in the side surface on the opposite side (+X side) to the side of expansion of the broad part 214a may be set in the same way as the second embodiment irrespective of presence/absence of the broad part 214a or may be set considering the provision of the broad part 214a. For example, the first cut away part 116a is provided in the broad part 214a in part or whole. Note that, the case where the entire first cut away part 116a is provided in the broad part 214a excludes a case in which the end part of the first cut away part 116a on the +Y' side matches with the end part of the front end side part 214b on the −Y' side.

As described above, in the present embodiment as well, in the same way as the first to fifth embodiments, the crystal has the base part 111, pair of vibrating parts 112, support part 214 (auxiliary part), and holding part 113, and the cut away parts 116 are formed in the side surfaces of the auxiliary part (support part 214) when viewed by a planar view, therefore the effects same as those by the first to fifth embodiments are exhibited. For example, the adjustment of frequency and the separation of the wiring parts 123 are facilitated.

Further, in the present embodiment, when viewed by a planar view, the support part 214 has the broad part 214a which is connected to the holding part 113 and expands to the vibrating part 112 side (−X side) in the alignment direction of the pair of vibrating parts 112 (X-axis direction) compared with the front end side part 214b of the support part 214.

Accordingly, for example, the characteristics of the crystal element using the crystal blank 210 are improved by the provision of the broad part 214a. Specifically, when widening the width of the support part as a whole, usually, the characteristics of the crystal device are improved. The reason for this is for example considered to be that the natural frequency of the support becomes higher, so the difference from the natural frequency of the vibrating parts 112 becomes large. The broad part 214a can exhibit an effect resembling that by widening the width of the support as a whole. On the other hand, the broad part 214a is provided only on the root side. Therefore, compared with the case where the entire support is widened, the possibility of abutting against the vibrating parts 112 is low. From another viewpoint, in the case where the entire support is widened, the support part must be widened to the opposite side (+X side) to the pair of vibrating parts. However, in the present embodiment, the support part 214 (broad part 214a) can be widened to the vibrating part 112 side, therefore the crystal 210 is reduced in size as a whole.

Further, in the present embodiment, a cut away part 116 (for example, the second cut away part 116b) is formed in the broad part 214a.

Accordingly, for example, compared with the case where the second cut away part 116b is provided in the side surface of the front end side part 214b (this case is also included in the invention of the present application), in the support part 214, it is suppressed that the part connecting the front end side and the root side from the second cut away part 116b becomes narrow. As a result, the strength of the support part 214 is improved. Even if the inner surface of the second cut away part 116b on the opposite side (+X side) to the vibrating part 112 side becomes flush with the side surface of the front end side part 214b on the vibrating part 112 side (−X side), compared with the case where the second cut away part 116b cuts into the side surface of the front end side part 214b, the strength of the support part 214 is improved. If the inner surface of the second cut away part 116b on the +X side is separated from the side surface of the front end side part 214b on the −X side, the effect of reinforcement of strength of the support part 214 becomes larger.

Further, in the first cut away part 116a which cuts into the side surface on the opposite side (+X side) to the side of expansion of the broad part 214a (vibrating part 112 side), when at least a part of the range of arrangement thereof in the Y'-axis direction overlaps at least a part of the range of arrangement of the broad part 214a in the Y'-axis direction, in the same way as the case in the third embodiment where at least a part of the protruding part 115 overlaps at least a part of the range of arrangement of the first cut away part 116a, the strength of the support part 214 which was lowered by the first cut away part 116a can be compensated for by the broad part 214a.

The present invention is not limited to the above embodiments and may be worked in various ways.

In the embodiments, the pair of vibrating parts and supports were perpendicular in their extension direction to the X-axis, but may be inclined relative to the X-axis as well. Further, the relative positions of the pair of vibrating parts and the support may be reverse to those in the embodiments in plus/minus sign of the X-axis. The relative positions of the pair of vibrating parts and the support may be reverse to those in the embodiments concerning the plus/minus sign of the Y'-axis. The upper and lower surfaces of the crystal blank (the surface provided with the terminal part and the surface not provided with the same) may be reverse to those in the embodiments concerning the plus/minus sign of the Z'-axis.

The first to sixth embodiments may be suitably combined. For example, in the sixth embodiment, the first cut away part 116a on the +X side, in the same way as the second and third embodiments, was provided in the side surface of the support which linearly extended from the root to the front end. However, in the same way as the first and fourth embodiments, it may be provided in a protruding part 115 as well.

The two terminal parts may be provided at any two points among the three points of the front end side part of the support part, the root side part of the support part (connection part of the holding part with the support part), and the part of the holding part on the opposite side to the support (the part supported by the pillow part 133 in the embodiments). For example, in the embodiments, the second terminal part 122b which is provided on the root side in the support part 114 may be provided as it is, the first terminal part 122a provided on the front end side in the support part 114 may be provided in the part of the holding part 113 which protrudes from the base part 111 to the −X side (the part supported by the pillow part 133 in the embodiments), and the front end side part of the support part 114 may be supported by the pillow part 133.

In the embodiments, the holding part 113 had the part protruding to the −X side relative to the base part 111, but this part may be omitted as well. Further, this protruding part and the part in the holding part which connects the support part and the base part may be different in size in the Y'-axis direction. The holding part does not have to be connected to the base part over the entire width of the base part (X-axis direction). For example, it may be connected to a part of the side surface of the base part which faces the −Y' side.

The shapes of the cut away parts are not limited to linear shapes and L-shapes. For example, the cut away parts may include curved parts in part or in whole or may include widened parts.

In the explanation of the present embodiment, as the effects of the slits, facilitation of adjustment of frequency and separation of wiring parts (suppression of short-circuiting) etc. were mentioned, but it is not necessary to exert all of these effects. For example, the cut away parts may contribute to only the separation of the wiring parts and need not contribute to enhancement of the natural frequency of the support part. Further, they may contribute to effects other than those described above, for example, lessening of stress generated in the conductive adhesive 134 as well.

Note that, from the present embodiment, the following invention which does not have cut away parts as a requirement can be extracted:

A tuning fork type crystal blank comprising:

a base part, a pair of vibrating parts which extend from the base part parallel with each other, a support part which is located at one side of an alignment direction of the pair of vibrating parts relative to the base part and pair of vibrating parts and extends parallel with the pair of vibrating parts, and a holding part which is located on the opposite side to the pair of vibrating parts relative to the base part and connects the base part and the support part, wherein the support part, when viewed by a planar view, comprises a broad part which is connected with the holding part and expands to the paired vibrating part side in the alignment direction compared with the front end side part of the support part.

Further, a tuning fork type crystal element comprising the above crystal blank and a crystal device comprising the tuning fork type crystal element.

Priorities are claimed on Japanese application No. 2015-192408 filed on Sep. 30, 2015, and Japanese application No. 2016-107085 filed on May 30, 2016, the contents of which are incorporated herein by reference.

REFERENCE SIGNS LIST

100 . . . tuning fork type crystal element
110, 210, 510 . . . crystal blanks
111 . . . base part
112 . . . vibrating part
113 . . . holding part
114 . . . support part
115 . . . protruding part
116 . . . cut away part
117 . . . weight part
118 . . . groove part
119 . . . auxiliary part
120 . . . metal pattern
121 . . . excitation electrode part
122 . . . terminal part
123 . . . wiring part
124 . . . frequency adjustment part
130*a* . . . board part
130*b* . . . frame part
131 . . . connection pad
132 . . . external terminal
133 . . . pillow part
134 . . . conductive adhesive
140 . . . lid member
141 . . . joining material
151 . . . crystal device.

The invention claimed is:

1. A tuning fork type crystal blank comprising:
a base part,
a pair of vibrating parts which extend from the base part in parallel with each other,
an auxiliary part comprising a support part which is located at one side of the base part and the pair of vibrating parts in an alignment direction of the pair of vibrating parts and extends parallel with the pair of vibrating parts, and
a holding part which is located on the side of the base part opposite to the pair of vibrating parts and connects the base part and the support part,
wherein a cut away part is formed in a side surface of the auxiliary part when viewed in a planar view direction which is perpendicular to the alignment direction and the extension direction of the pair of vibrating parts,
wherein the auxiliary part further comprises a protruding part which protrudes from a side surface of the support part, and
wherein the cut away part is formed in a side surface of the protruding part.

2. The tuning fork type crystal blank according to claim 1, wherein, when viewed in the planar view direction,
the protruding part forms a substantially rectangular shape, and
the cut away part is formed in the surface of the protruding part which becomes parallel with a side surface of the holding part from which the support part extends outward.

3. The tuning fork type crystal blank according to claim 2, wherein the cut away part is formed in the surface of the protruding part which faces the opposite side from the holding part.

4. The tuning fork type crystal blank according to claim 3, wherein, when viewed in the planar view direction, the length of the protruding part parallel with a direction in which the support part extends is 10% to 25% of the length of the support part parallel with the direction in which the support part extends.

5. The tuning fork type crystal blank according to claim 4, wherein, when viewed in the planar view direction, the length of the cut away part parallel with the direction in which the support part extends is 40% to 90% of the length of the protruding part parallel with the direction in which the support part extends.

6. The tuning fork type crystal blank according to claim 1, further comprising a pair of weight parts at the end parts of the pair of vibrating parts at the sides opposite to the base part, wherein,
when viewed in the planar view direction, the protruding part is located at the holding part side from the pair of weight parts and is located at the weight part side from the base part.

7. A tuning fork type crystal blank comprising:
a base part,
a pair of vibrating parts which extend from the base part in parallel with each other,
an auxiliary part comprising a support part which is located at one side of the base part and the pair of vibrating parts in an alignment direction of the pair of vibrating parts and extends parallel with the pair of vibrating parts, and
a holding part which is located on the side of the base part opposite to the pair of vibrating parts and connects the base part and the support part,
wherein a cut away part is formed in a side surface of the auxiliary part when viewed in a planar view direction which is perpendicular to the alignment direction and the extension direction of the pair of vibrating parts,
wherein the cut away part is formed in a first side surface of the support part, wherein the cut away part comprises
an entrance opened in the first side surface, and
a part which is concealed when viewing the cut away part from the entrance in a direction perpendicular to the region around the entrance in the first side surface.

8. The tuning fork type crystal blank according to claim 7, wherein:
the region around the entrance is parallel with a direction in which the support part extends, and
the cut away part comprises
an entrance side part which extends from the entrance so as to cross the direction in which the support part extends and
a deep side part which extends from the opposite side to the entrance in the entrance side part so as to follow the direction in which the support part extends.

9. The tuning fork type crystal blank according to claim 7, wherein the first side surface is a surface which linearly extends from the root to the front end of the support part in parallel with the pair of vibrating parts and faces the opposite side from the pair of vibrating parts in the alignment direction.

10. The tuning fork type crystal blank according to claim 7, further comprising a protruding part which protrudes from a second side surface of the support part at the opposite side to the first side surface and which comprises at least part of its range of arrangement in a direction in which the support part extends overlapping at least part of the range of arrangement of the cut away part.

11. The tuning fork type crystal blank according to claim 10, wherein, when viewed in the planar view direction, another cut away part is formed in the protruding part.

12. The tuning fork type crystal blank according to claim 7, wherein the support part comprises a broad part which is connected to the holding part and expands to the vibrating part side in the alignment direction when compared with a front end side part of the support part.

13. The tuning fork type crystal blank according to claim 12, wherein the cut away part in the first side surface is formed in the broad part.

14. A tuning fork type crystal element comprising:
a tuning fork type crystal blank according to claim 1 and
metal patterns provided on the surface of the tuning fork type crystal blank, wherein
the metal patterns comprises
first excitation electrode parts which are located on the pair of vibrating parts,
second excitation electrode parts which are located on the pair of vibrating parts,
a first terminal part which is located on a part in the support part at front end side from the base part or located on a part in the holding part on the side opposite to the support part in the alignment direction,
a second terminal part which is located on at least one of the root side part in the support part and a part in the holding part on the support side in the alignment direction,
a first wiring part which connects the first excitation electrode parts and the first terminal part, and
a second wiring part which connects the second excitation electrode parts and the second terminal part.

15. The tuning fork type crystal element according to claim 14, wherein the crystal blank is exposed at the inner wall surfaces of the cut away part.

16. The tuning fork type crystal element according to claim 15, wherein:
the first terminal part is located in the front end side part of the support part, and
the cut away part is located between the first terminal part and the second terminal part.

17. A tuning fork type crystal element comprising:
a tuning fork type crystal blank comprising:
a base part,
a pair of vibrating parts which extend from the base part in parallel with each other,
an auxiliary part comprising a support part which is located at one side of the base part and the pair of vibrating parts in an alignment direction of the pair of vibrating parts and extends parallel with the pair of vibrating parts, and
a holding part which is located on the side of the base part opposite to the pair of vibrating parts and connects the base part and the support part, wherein a cut away part is formed in a side surface of the auxiliary part when viewed in a planar view direction which is perpendicular to the alignment direction and the extension direction of the pair of vibrating parts; and
metal patterns provided on the surface of the tuning fork type crystal blank, wherein the metal patterns comprises
first excitation electrode parts which are located on the pair of vibrating parts,
second excitation electrode parts which are located on the pair of vibrating parts,
a first terminal part which is located on a part in the support part at front end side from the base part or located on a part in the holding part on the side opposite to the support part in the alignment direction,
a second terminal part which is located on at least one of the root side part in the support part and a part in the holding part on the support side in the alignment direction,
a first wiring part which connects the first excitation electrode parts and the first terminal part, and
a second wiring part which connects the second excitation electrode parts and the second terminal part,
wherein the crystal blank is exposed at the inner wall surfaces of the cut away part,
wherein the first terminal part is located in the front end side part of the support part,
wherein the cut away part is located between the first terminal part and the second terminal part,
wherein the cut away part comprises an entrance opened in the side surface of the auxiliary part,
wherein the first wiring part comprises a part which is located on the side surface of the auxiliary part at the front end side of the support part from the entrance,
wherein the second wiring part comprises a part which is located on the side surfaces of the auxiliary part at the root side of the support part from the entrance.

18. A crystal device comprising:
a tuning fork type crystal element according to claim 14,
a board part provided with a pair of connection pads to which the first terminal part and the second terminal part are electrically joined,
a frame part which is integrally provided with the board part along the edge part of the upper surface of the board part, and
a lid member which is joined to the upper surface of the frame part.

19. A tuning fork type crystal element comprising:
a tuning fork type crystal blank according to claim 7 and
metal patterns provided on the surface of the tuning fork type crystal blank, wherein the metal patterns comprise
  first excitation electrode parts which are located on the pair of vibrating parts,
  second excitation electrode parts which are located on the pair of vibrating parts,
  a first terminal part which is located on a part in the support part at front end side from the base part or located on a part in the holding part on the side opposite to the support part in the alignment direction,
  a second terminal part which is located on at least one of the root side part in the support part and a part in the holding part on the support side in the alignment direction,
  a first wiring part which connects the first excitation electrode parts and the first terminal part, and
  a second wiring part which connects the second excitation electrode parts and the second terminal part.

20. A crystal device comprising:
a tuning fork type crystal element according to claim 19,
a board part provided with a pair of connection pads to which the first terminal part and the second terminal part are electrically joined,
a frame part which is integrally provided with the board part along the edge part of the upper surface of the board part, and
a lid member which is joined to the upper surface of the frame part.

* * * * *